US010538841B2

(12) United States Patent
Kawahara et al.

(10) Patent No.: US 10,538,841 B2
(45) Date of Patent: Jan. 21, 2020

(54) WATER-BARRIER LAMINATE

(71) Applicant: TOYO SEIKAN GROUP HOLDINGS, LTD., Tokyo (JP)

(72) Inventors: Naru Kawahara, Yokohama (JP); Shunya Nangou, Yokohama (JP); Kota Mori, Yokohama (JP); Shinpei Okuyama, Yokohama (JP)

(73) Assignee: TOYO SEIKAN GROUP HOLDINGS, LTD., Tokyo (JP)

( * ) Notice: Subject to any disclaimer, the term of this patent is extended or adjusted under 35 U.S.C. 154(b) by 0 days.

(21) Appl. No.: 15/501,701

(22) PCT Filed: Jul. 29, 2015

(86) PCT No.: PCT/JP2015/071507
§ 371 (c)(1),
(2) Date: Feb. 3, 2017

(87) PCT Pub. No.: WO2016/021459
PCT Pub. Date: Feb. 11, 2016

(65) Prior Publication Data
US 2017/0226625 A1    Aug. 10, 2017

(30) Foreign Application Priority Data

Aug. 7, 2014  (JP) .................. 2014-161901

(51) Int. Cl.
*C08J 7/04*    (2006.01)
*C23C 14/24*    (2006.01)
(Continued)

(52) U.S. Cl.
CPC .............. *C23C 14/24* (2013.01); *B32B 27/18* (2013.01); *C08J 7/045* (2013.01);
(Continued)

(58) Field of Classification Search
CPC .............................. C08L 23/0876; C08J 7/045
See application file for complete search history.

(56) References Cited

U.S. PATENT DOCUMENTS 4,753,845 A  *  6/1988  Sumi ...................... B32B 27/18
                                                      428/327
5,853,867 A     12/1998  Harada et al.
(Continued)

FOREIGN PATENT DOCUMENTS

CN    102166511 A    8/2011
CN    105102215 A    11/2015
(Continued)

OTHER PUBLICATIONS

English machine translation of JP 2009-090633 to Ito et al., obtained on Jun. 26, 2017 from JPO.*
(Continued)

*Primary Examiner* — Monique R Jackson
(74) *Attorney, Agent, or Firm* — Sughrue Mion, PLLC

(57) ABSTRACT

A water-barrier laminate having a water-trapping layer (1) in which a hygroscopic agent is dispersed, wherein a hygroscopic agent has such a hygroscopic property that the ratio (Ax/Ay) of a hygroscopic amount Ax at a relative humidity of 80% and a hygroscopic amount Ay at a relative humidity of 30% is not less than 3, and the water-trapping layer is positioned between the two inorganic barrier layers (3a) and (3b). The water-barrier laminate exhibits barrier property against the water over extended periods of time.

3 Claims, 4 Drawing Sheets aa: INORGANIC BARRIER LAYER

(51) Int. Cl.
*B32B 27/18* (2006.01)
*C23C 16/455* (2006.01)
*C23C 16/50* (2006.01)

(52) U.S. Cl.
CPC ........ *C23C 16/45525* (2013.01); *C23C 16/50* (2013.01); *B32B 2307/7246* (2013.01)

(56) References Cited

U.S. PATENT DOCUMENTS

| | | | |
|---|---|---|---|
| 6,432,516 B1* | 8/2002 | Terasaki | B32B 27/08 |
| | | | 428/195.1 |
| 7,759,570 B2* | 7/2010 | Sakai | C08L 33/12 |
| | | | 84/427 |
| 9,493,348 B2 | 11/2016 | Ramadas et al. | |
| 9,676,171 B2* | 6/2017 | Okuyama | B32B 9/00 |
| 2005/0249901 A1* | 11/2005 | Yializis | B32B 7/02 |
| | | | 428/35.7 |
| 2012/0118832 A1* | 5/2012 | Yontz | B01J 20/264 |
| | | | 210/728 |
| 2015/0368498 A1 | 12/2015 | Okuyama et al. | |
| 2016/0243801 A1 | 8/2016 | Okuyama et al. | |

FOREIGN PATENT DOCUMENTS

| | | |
|---|---|---|
| EP | 2 955 017 A1 | 12/2015 |
| JP | 3-182347 A | 8/1991 |
| JP | 9-137072 A | 5/1997 |
| JP | 2000-255579 A | 9/2000 |
| JP | 2006-168298 A | 6/2006 |
| JP | 2007-536169 A | 12/2007 |
| JP | 2009-90633 A | 4/2009 |
| JP | 2010-511267 A | 4/2010 |
| JP | 2010-116435 A | 5/2010 |
| JP | 2010-116436 A | 5/2010 |
| JP | 2011-131395 A | 7/2011 |
| WO | 2015/053340 A1 | 4/2015 |

OTHER PUBLICATIONS

English machine translation of JP 2010-116435 to Ishihara et al., obtained on Jun. 26, 2017 from JPO.*
Japan EXLAN Products, "TAFTIC HU (RTM)", screenshot of http://www.exlan.co.jp/en/products/tafticHU.html dated Mar. 3, 2008. (Year: 2008).*
TAFTIC(TM) HU Series leaflet, Toyobo Group EXLAN, downloaded from https://www.exlan.co.jp/en/products/function/lineup/taftic-hu/ on Apr. 15, 2019. (Year: 2019).*
International Search Report of PCT/JP2015/071507, dated Oct. 27, 2015. [PCT/ISA/210].
Communication dated Jan. 2, 2018, from European Patent Office in counterpart application No. 15828928.0.
Communication dated May 30, 2018, from the State Intellectual Property Office of People's Republic of China in counterpart Application No. 201580054387.1.
Method and for producing super absorbent resin, 2004, pp. 7-13 (10 pages total), ISBN 7-5025-5283-9, Chemical Industry Press.
Communication dated Sep. 20, 2018, issued by the Korean Intellectual Property Office in corresponding Korean Application No. 10-2017-7005949.
Notification of Reasons for Refusal dated May 7, 2019 from the Japanese Patent Office in application No. 2016-540172.

* cited by examiner

WATER-BARRIER LAMINATE

CROSS REFERENCE TO RELATED APPLICATIONS

This application is a National Stage of International Application No. PCT/JP2015/071507 filed Jul. 29, 2015, claiming priority based on Japanese Patent Application No. 2014-161901, filed Aug. 7, 2014, the contents of all of which are incorporated herein by reference in their entirety.

TECHNICAL FIELD

This invention relates to a water-barrier laminate having a water-trapping layer that contains a hygroscopic agent.

BACKGROUND ART

As means for improving properties and, specifically, gas-barrier property of various plastic base materials, there has been known an art of forming an inorganic barrier layer of a silicon oxide or the like by vacuum evaporation on the surfaces of the plastic base materials (patent document 1).

In a variety of kinds of electronic devices that have been developed and put into practice in recent years, such as organic electroluminescent (organic EL) devices, solar cells, touch panels, e-papers and the like, that must avoid leakage of the electric charges, it is a requirement to impart a high degree of water-barrier property to the plastic base materials forming the circuit boards or to the films sealing the circuit boards. However, the inorganic barrier layer formed as described above is not capable of meeting the requirement for attaining water-barrier property of a high level. Therefore, a variety of proposals have been made for improving water-barrier property.

A patent document 2, for example, proposes a gas-barrier laminate comprising an inorganic barrier layer formed on the surface of a plastic base material, and a sealing layer formed on the inorganic barrier layer, the sealing layer being dispersed with nanoparticles of a metal oxide or carbon nanotubes as a hygroscopic agent.

A patent document 3 proposes a gas-barrier laminate (film) comprising an inorganic barrier layer, an organic layer and a water-trapping layer formed on a base film, the water-trapping layer being formed of a hygroscopic polymer (concretely, a polyamide) or being formed by dispersing a hygroscopic material such as silica gel or aluminum oxide in a high molecular binder such as a resin that can be cured with electron rays or ultraviolet rays.

Further, a patent document 4 proposes a gas-barrier laminate comprising a gas-barrier film and a hygroscopic layer formed by vacuum evaporation on the surface of a plastic base material, the hygroscopic layer containing an alkylene oxide, acrylate nanoparticles or an organometal complex.

However, the gas-barrier laminates proposed by the above patent documents 2 to 4 are not still capable of attaining high degrees of water-barrier property. To attain a super-barrier property against water such that a water vapor permeability is, for example, $10^{-5}$ g/m$^2$/day or less, it becomes necessary to employ a layer structure that includes many layers (hygroscopic layers or sealing layers) for absorbing moisture. As a result, a lot of laborious work is needed for forming a multi-layered structure causing a decrease in the productivity. Therefore, it has been desired to further improve water-barrier properties. Besides, there still remains a problem in that upon absorbing the moisture, the layers (hygroscopic layers or sealing layers) for absorbing moisture undergo swelling and lose dimensional stability. Therefore, it has been desired to provide a hygroscopic layer that is capable of exhibiting excellent hygroscopic property over extended periods of time for also realizing super-barrier property using the layers of a number as small as possible.

To meet the above requirements, the present applicant has previously proposed a gas-barrier laminate having a water-trapping layer in which a specific hygroscopic agent was dispersed in the matrix of an ionic polymer, the water-trapping layer being formed on an inorganic barrier layer on a plastic base material (JP-A-2013-22253, JP-A-2013-022656 and JP-A-2014-41672). In the gas-barrier laminate proposed here, the water-trapping layer effectively traps water. Therefore, the gas-barrier laminate not only exhibits very excellent water barrier property but also effectively suppresses the water-trapping layer from swelling despite of having absorbed moisture.

PRIOR ART DOCUMENTS

Patent Documents

Patent document 1: JP-A-2000-255579
Patent document 2: JP-A-2010-511267
Patent document 3: JP-A-2009-90633
Patent document 4: JP-A-2011-131395

OUTLINE OF THE INVENTION

Problems that the Invention is to Solve

The present inventors have furthered the study concerning the laminate that has a water-trapping layer in which the above-mentioned specific hygroscopic agent is dispersed in a resin matrix thereof. As a result, the inventors have newly discovered the fact that in case a hygroscopic agent having a specific hygroscopic property is being dispersed, a high degree of hygroscopic capability is maintained for extended periods of time and excellent water-barrier property is exhibited if the water-trapping layer is sandwiched by the inorganic barrier layers.

It is, therefore, an object of the present invention to provide a water-barrier laminate which has a water-trapping layer in which the hygroscopic agent is dispersed and which exhibits barrier property against the moisture over extended periods of time.

Means for Solving the Problems

According to the present invention, there is provided a water-barrier laminate having a water-trapping layer in which a hygroscopic agent is dispersed, wherein the hygroscopic agent has such a hygroscopic property that the ratio (Ax/Ay) of the hygroscopic amount Ax at a relative humidity of 80% and the hygroscopic amount Ay at a relative humidity of 30% is 3 or more, and the water-trapping layer is positioned between the two inorganic barrier layers.

In the water-barrier laminate of the present invention, it is desired that:

(1) The hygroscopic agent has a grain size of than 3 µm or less;

(2) The hygroscopic agent is a crosslinked product of a monovalent metal salt of a poly(meth)acrylic acid;

(3) The water-trapping layer has a dispersion structure in which the hygroscopic agent is dispersed in a matrix of an ionic polymer;

(4) The hygroscopic agent is used in an amount of 50 to 1300 parts by mass per 100 parts by mass of the ionic polymer;
(5) A crosslinked structure is introduced in the ionic polymer that is forming the matrix;
(6) An organic layer is provided between the inorganic barrier layer on the side of absorbing water and the water-trapping layer; and
(7) The two inorganic barrier layers comprise a first inorganic barrier layer formed on a plastic base material and a second inorganic barrier layer formed, via an organic layer, on the water-trapping layer positioned on the first inorganic barrier layer.

Effects of the Invention

The invention uses the hygroscopic agent having such a hygroscopic property that the ratio ($A_x/A_y$) of the hygroscopic amount $A_x$ at a relative humidity of 80% and the hygroscopic amount $A_y$ at a relative humidity of 30% is not less than 3. The above hygroscopic ratio ($A_s/A_y$) means that the hygroscopic agent exhibits a high degree of hygroscopic property in a highly humid environment. That is, the water-barrier laminate of the invention has a novel feature in that it uses a hygroscopic agent that exhibits a high degree of hygroscopic property in a highly humid environment and that it has a structure in which the water-trapping layer containing the hygroscopic agent dispersed therein is sandwiched by the inorganic barrier layers. Owing to the above-mentioned feature, the water-trapping layer exhibits barrier property against water over extended periods of time.

Here, if reference is made to Examples appearing later, Example 1 deals with a water-barrier laminate having a water-trapping layer that uses a hygroscopic agent (cross-linked product of Na poly(meth)acrylate) of which the hygroscopic ratio ($A_x/A_y$) is within the above-mentioned range. In Example 1, when the water-barrier laminate was stored in an atmosphere of 22° C. 60% RH for three months, the amount of water contained in the water-trapping layer was 1.31 times as great as the amount of water contained in the water-barrier laminate that was not sandwiched by the inorganic barrier layers (Comparative Example 2). Thus the water could be contained in a very increased amount. On the other hand, Comparative Example 1 deals with a water-barrier laminate having a water-trapping layer formed by using a hygroscopic agent (zeolite) having poor hygroscopic property in a highly humid environment. If the water-barrier laminate was measured for its increase in the amount of water contained therein in the same manner as above, the amount of water contained therein has increased by 1.04 times and was considerably smaller than that of the laminate of Example 1.

Further, Comparative Example 2 deals with a water-barrier laminate having a water-trapping layer that is formed by using a hygroscopic agent of which the hygroscopic ratio ($A_s/A_y$) is within the above-mentioned range but that has not been sandwiched by the inorganic barrier layers. In this case, an increase in the amount of water contained therein measured in the same manner as described above was 1.00 time. In this case, too, therefore, the amount of water contained therein has increased very small as compared to that of the laminate of Example 1.

As will be understood from the above facts, therefore, the water-trapping layer in the present invention absorbs water in large amounts and, therefore, is capable of exhibiting water-barrier property excellently over extended periods of time.

That is, in the invention, since the water-trapping layer is sandwiched by the inorganic barrier layer, water absorbed by the water-trapping layer is released little. Therefore, as the water-trapping layer continues to absorb the moisture, the humidity becomes high around the hygroscopic agent in the water-trapping layer. However, the present invention uses a hygroscopic agent that is highly hygroscopic in a highly humid environment. With the water-barrier laminate of the present invention, therefore, the hygroscopic agent that is highly hygroscopic in the highly humid environment exhibits its property to a maximum degree, and the water-trapping layer absorbs the water in very increased amounts. As a result, the water-barrier laminate becomes capable of exhibiting its excellent water-barrier property over extended periods of time.

The water-trapping layer that secures water-barrier property has heretofore been designed by paying attention to the hygroscopic property of the hygroscopic agent in a lowly humid environment. It is an art that was not quite conducted in the past to form the water-trapping layer by paying attention to the hygroscopic property in a highly humid environment as contemplated by the present invention.

As described above, the water-barrier laminate of the present invention exhibits excellent water-barrier property over extended periods of time and is useful as a substrate or a sealing layer for various electronic devices, and can be favorably applied, specifically, for protecting the organic electroluminescent (organic EL) panels from the moisture.

MODES FOR CARRYING OUT THE INVENTION

Figure 1:
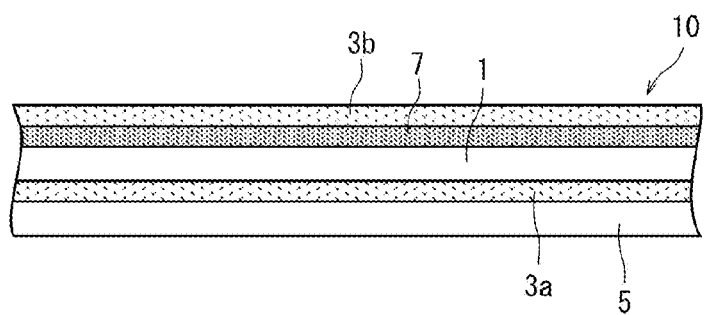
FIG. 1 is a sectional view schematically illustrating a structure of layers of a water-barrier laminate of the present invention.

Referring to FIG. 1 which illustrates the structure of layers of the water-barrier laminate of the invention, the laminate generally designated at 10 includes a water-trapping layer 1 having a predetermined hygroscopic property, which is sandwiched by a pair of inorganic barrier layers 3a and 3b.

Of the inorganic barrier layers 3a and 3b, one inorganic barrier layer 3a (hereinafter often called first inorganic barrier layer) is formed on a predetermined plastic base material 5. The water-trapping layer 1 is formed on the first inorganic barrier layer 3a. The other inorganic barrier layer 3b (hereinafter often called second inorganic barrier) is formed on the water-trapping layer 1 via an organic layer 7.
<Water-trapping Layer 1>

In the invention, the water-trapping layer 1 has a structure in which a hygroscopic agent is dispersed in a matrix of a polymer, the hygroscopic agent exhibiting a high degree of hygroscopic property under highly humid conditions. Concretely speaking, the hygroscopic agent has such a hygroscopic property that the ratio (Ax/Ay) of the hygroscopic amount Ax at a relative humidity of 80% and the hygroscopic amount Ay at a relative humidity of 30% is not less than 3, and the water-trapping layer containing the hygroscopic agent is sandwiched by the pair of inorganic barrier layers. Therefore, the hygroscopic agent is allowed to exhibit its excellent hygroscopic property to a maximum degree, and the laminate 10 sustains its very high water-barrier property over extended periods of time.

Namely, in the invention, since the water-trapping layer 1 is sandwiched by the inorganic barrier layers 3a and 3b, water absorbed by the water-trapping layer 1 (water absorbed by the hygroscopic agent) is effectively suppressed from being released. Therefore, as the hygroscopic agent in the water-trapping layer 1 continues to absorb water, the humidity continues to increase around the hygroscopic agent. Here, however, as will be obvious from the above-mentioned hygroscopic ratio (Ax/Ay), the hygroscopic agent used here has a large amount of absorption under highly humid conditions. Accordingly, the amount of water that is absorbed reaches a saturated amount of water spending extended periods of time. Therefore, excellent hygroscopic capability is exhibited and excellent water-barrier property is exhibited over extended periods of time. For example, if there is used a hygroscopic agent having a hygroscopic ratio (Ax/Ay) that is smaller than the above-mentioned range, water can be absorbed in a small amount under highly humid conditions. Therefore, the amount of water that is absorbed reaches the saturation in short periods of time, and excellent water-barrier property cannot be exhibited over extended periods of time.

In the invention, specifically, an organic polymer can be used as the hygroscopic agent that exhibits the above-mentioned hygroscopic ratio (Ax/Ay). For instance, with the inorganic hygroscopic agent such as zeolite, the hygroscopic property is produced by the physical action of trapping water based on pores formed in the particles. Therefore, the hygroscopic property varies little depending on the humidity, and the above-mentioned hygroscopic ratio (Ax/Ay) is not satisfied. With the organic polymer, on the other hand, chemical action of adsorbing water is a major factor of the hygroscopic property and, therefore, the hygroscopic property varies greatly depending on the humidity. In the present invention, therefore, an organic polymer is selected that exhibits the above-mentioned hygroscopic ratio (Ax/Ay) and is used as the hygroscopic agent.

In the invention, as the hygroscopic agent (organic polymer) that exhibits the above-mentioned hygroscopic ratio (Ax/Ay), there can be exemplified an anionic polymer or a crosslinked product of a partly neutralized product thereof. As the anionic polymer, there can be exemplified at least one of anionic monomers such as carboxylic acid monomers ((meth)acrylic acid, maleic anhydride or the like), sulfonic acid monomer (halogenated vinyl sulfonate, styrene sulfonate, vinyl sulfonate or the like), phosphoric acid monomer (vinyl phosphate or the like), or a salt thereof, that is polymerized or is copolymerized with other monomers.

The above organic polymer not only satisfies the above-mentioned hygroscopic ratio (Ax/Ay) but also attains a humidity lower than that attained by the matrix (medium in which the hygroscopic agent is dispersed) that forms the water-trapping layer 1. For instance, the above organic polymer attains a humidity of not 6% or low in an environmental condition of a humidity of 80% RH and a temperature of 30° C., and thus has a very high hygroscopic capability.

In the invention, further, among the above organic polymers, it is preferred to use a granular crosslinked product of a monovalent metal salt (e.g., Na salt or K salt) of a poly(meth)acrylic acid. That is, the granular crosslinked product has a crosslinked structure and is not almost swollen by water and, besides, releases water very little. Therefore, water that has permeated through the matrix of the water-rapping layer 1 is readily trapped by the hygroscopic agent (crosslinked particles); i.e., water that is absorbed is effectively confined in the water-trapping layer 1. As a result, water trapped in the water-trapping layer 1 is effectively suppressed from being released. Therefore, the water-trapping layer 1 not only exhibits excellent hygroscopic property but is also effectively suppressed from swelling (undergoing dimensional change) despite of having absorbed water.

Further, the crosslinked particles of the monovalent metal salt of the poly(meth)acrylic acid are fine spherical particles obtained by polymerizing and curing a (meth)acrylic monomer that contains a trifunctional or more highly functional (meth)acrylate by the suspension polymerization or emulsion polymerization. The crosslinked particles have a mean primary particle diameter $D_{50}$ of 100 nm or less and, specifically, 80 nm or less calculated as volume as measured by the laser diffraction-light scattering method. The crosslinked particles can be finely dispersed in the polymer that forms the matrix and are advantageous for maintaining transparency of the water-trapping layer 1. Besides, the particles have large specific surface areas and, hence, exhibit very high hygroscopic capability and exhibit excellent hygroscopic property as described above.

In the crosslinked particles of the monovalent metal salt of the poly(meth)acrylic acid, the metal salt is, usually, an Na salt or a K salt. For example, fine particles (average grain size of about 70 nm) of crosslinked Na polyacrylate have been placed in the market in the form of a colloidal dispersion solution (pH=10.4) by Toyobo Co. in the trade name of TAFTIC HU-820E.

As another preferred organic hygroscopic agent, there can be exemplified fine particles of a crosslinked polymer having potassium salt type carboxyl groups of which 80% or more of the carboxyl groups are neutralized with the potassium salt. The hygroscopic agent of the type of potassium salt does not release water which it has once absorbed even at high temperatures, and features excellent hygroscopic property at high temperatures.

The crosslinked polymer having such potassium salt type carboxyl groups can be prepared by any one of the following methods (A) to (D).

(A) Prepared by a method in which carboxyl groups of a carboxyl group-containing vinyl monomer such as (meth) acrylic acid or maleic acid are transformed into those of the potassium salt type, and the monomer thereof is homopolymerized, two or more kinds of monomers thereof are copolymerized, or the monomers thereof are copolymerized with another monomer copolymerizable therewith.

(B) Prepared by a method in which a carboxyl group-containing vinyl monomer is polymerized to obtain a polymer thereof, and the carboxyl groups possessed by the polymer are transformed into those of the potassium salt type.

(C) Prepared by a method in which carboxyl groups are introduced into a polymer by a chemical modification such as hydrolysis, and the carboxyl groups of the polymer are transformed into those of the potassium salt type.

(D) Prepared by a method in which a graft polymerization is executed while any one of the above methods (A) to (C) is being carried out.

According to the present invention, the above method (C) is specifically preferred.

In carrying out the above method (C), examples of the monomer used for preparing a polymer containing a reactive group formed by the carboxyl group through the hydrolysis will be cyano group-containing monomers such as acrylonitrile and methacrylonitrile, and derivatives (e.g., esters) of carboxylic acid such as of acrylic acid, methacrylic acid, maleic acid, itaconic acid and vinylpropionic acid.

Further, the above monomer can be copolymerized with other monomers. As the other monomers, though not specifically limited, there can be exemplified crosslinkable vinyl compounds such as glycidyl methacrylate, N-methylolacrylamide, hydroxyethyl methacrylate, triallylisocyanulate, triallyl cyanulate, divinylbenzene, ethylene glycol di(meth)acrylate, diethylene glycol di(meth)acrylate, triethylene glycol di(meth)acrylate, trimethylolpropane tri(meth)acrylate and methylene bisacrylamide.

In the invention, further, it is desired that the crosslinked polymer having a potassium salt type carboxyl group that is suited as a hygroscopic agent has, introduced therein, a sulfonic acid group and/or a salt type sulfonic acid group as polar groups other than the potassium salt type carboxyl group. As the monomer used for introducing the sulfonic acid (or a salt thereof), there can be exemplified vinylsulfonic acid (salt), (meth)allylsulfonic acid (salt), styrenesulfonic acid (salt), 4-sulfobutyl (meth)acrylate and salt thereof, methallyloxybenzenesulfonic acid (salt), allyloxybenzenesulfonic acid (salt), 2-acrylamide-2-methylpropanesulfonic acid (salt) and 2-sulfoethyl (meth)acrylate. In addition to copolymerizing the above sulfonic acid (salt thereof) group-containing monomers with the above-mentioned monomer, it is, further, allowable to introduce the sulfonic acid (salt) group to the polymer terminal by using an initiator or a chain transfer agent.

The crosslinked polymer having the potassium salt type carboxyl group can also be obtained by hydrolyzing, with a potassium hydroxide, a crosslinked polymer that contains a constituent unit having a reactive group formed by the carboxyl group through the hydrolysis and a constituent unit stemming from the divinylbenzene. The crosslinked polymer having the potassium salt type carboxyl group can be, further, obtained by converting the reactive group into the carboxylic acid group through the hydrolysis, and by exchanging the ions by the action of a solution containing potassium ions in large amounts, such as an aqueous solution of potassium hydroxide or an aqueous solution of potassium chloride, or by the action of an ion-exchange resin. The crosslinked polymer can be favorably used in the present invention as a hygroscopic agent.

In the invention, the hygroscopic agent is added in an amount of, desirably, 50 to 1300 parts by mass per 100 parts by mass of the polymer that forms the matrix of the water-trapping layer 1. Namely, upon being used in the above amount, the hygroscopic agent exhibits its excellent hygroscopic properties to a sufficient degree.

In the invention, the matrix of the water-trapping layer 1 may be formed by using any polymer so far as it is capable of forming a film. From the standpoint of maintaining a particularly high water-barrier property, however, it is desired that the matrix is formed by using an ionic polymer that has water-absorbing property.

The ionic polymer may be a cationic polymer (a1) or an anionic polymer (a2).

Figure 2:
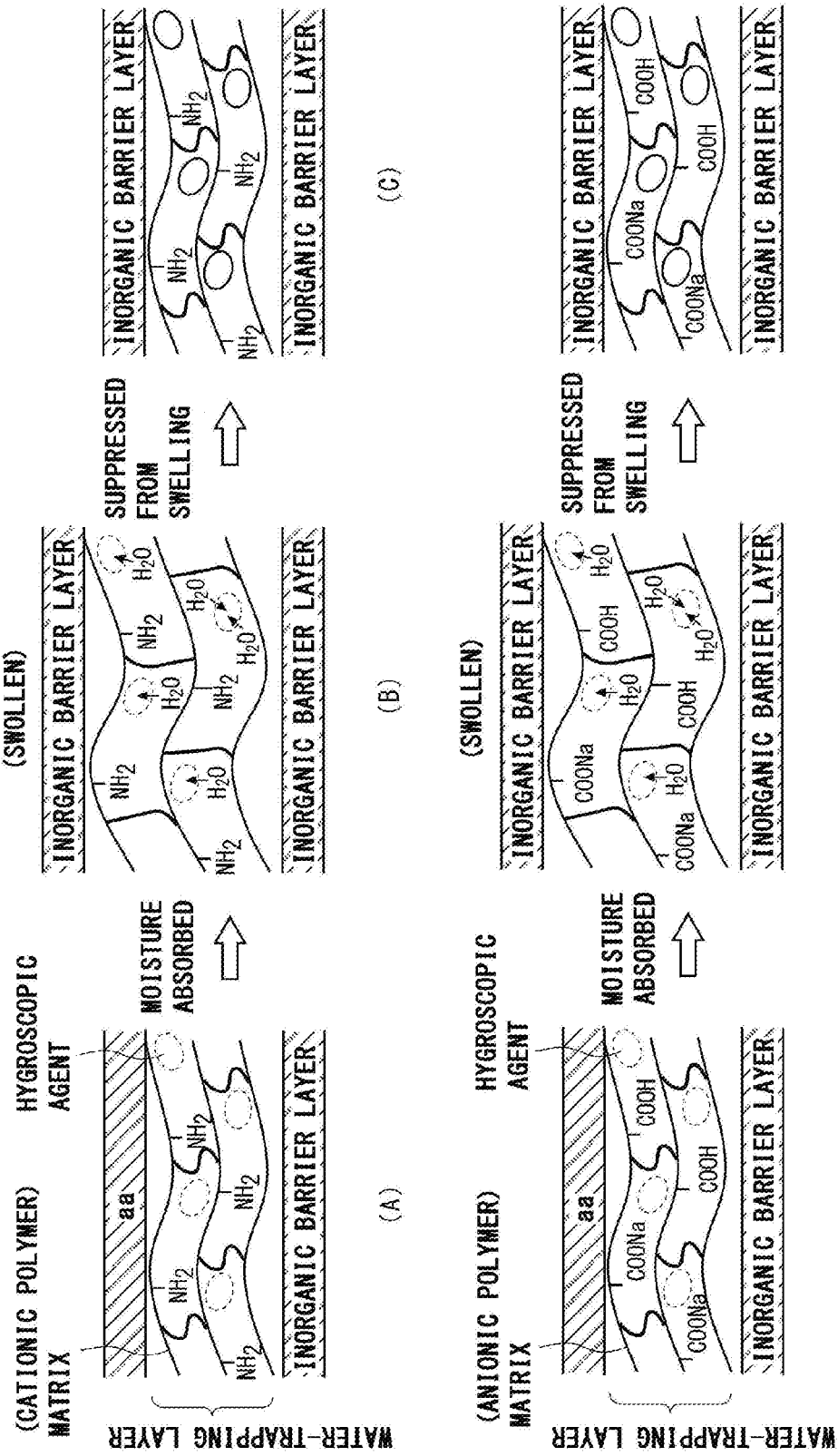
FIG. 2 is diagram illustrating the hygroscopic capability of a water-trapping layer that is forming a matrix of an ionic polymer.
Figure 3:
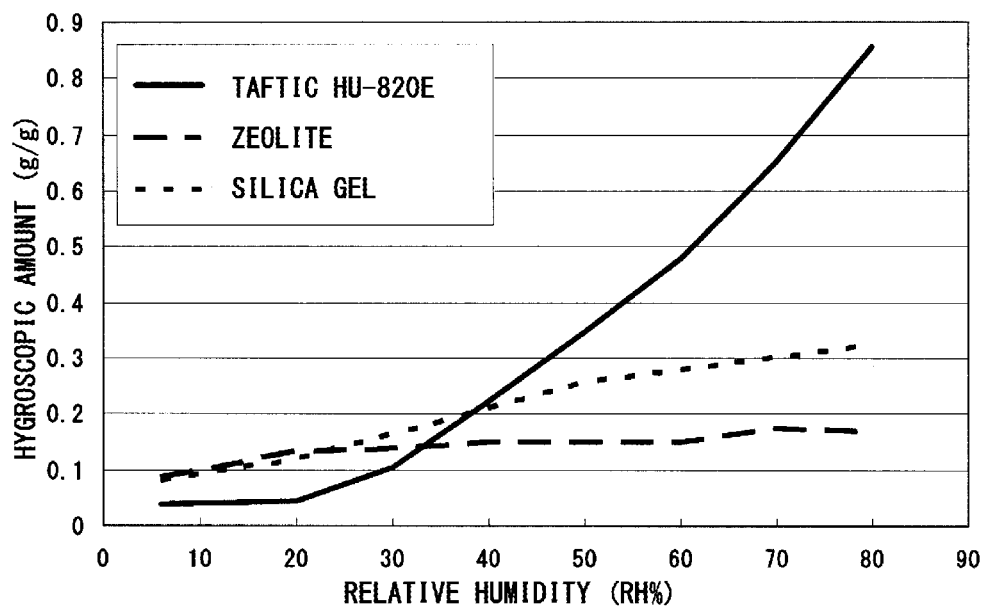
FIG. 3 is a graph illustrating relationships between the relative humidities and the amounts of the hygroscopic agent used in Examples and in Comparative Examples.

Reference is now made to FIG. 2 illustrating the hygroscopic capability of the water-trapping layer 1 that is forming the matrix of the ionic polymer. Here, the matrix of the water-trapping layer sandwiched by the inorganic barrier layers is formed by the cationic polymer (ionic groups are $NH_2$ groups) or by the anionic polymer (ionic groups are COONa groups and COOH groups). The above-mentioned hygroscopic agent is dispersed in the matrix (see FIG. 2(A)).

That is, in the water-trapping layer, water that has permeated through the inorganic barrier layers is absorbed by the matrix that contains the hydrophilic cationic groups or anionic groups (see FIG. 2(B)). That is, the matrix by itself exhibits a high degree of hygroscopic property.

Here, water that is simply absorbed by the matrix could be easily released if there is a change in the environment such as a rise in temperature. Besides, water that has infiltrated widens the gap among the polymer molecules that are forming the matrix and, therefore, causes the water-trapping layer to swell. The water-trapping layer that has swollen could lose its dimensional stability.

In the present invention, however, the hygroscopic agent (e.g., granular crosslinked product of a monovalent metal salt of poly(meth)acrylic acid) dispersed in the ionic matrix has a hygroscopic property larger (i.e., attains a humidity lower) than that of the cationic polymer or the anionic polymer that is forming the matrix. Therefore, water absorbed in the matrix is more reliably trapped by the hygroscopic agent (see FIG. 2(C)). This effectively suppresses the swelling despite water molecules are absorbed. Still more, the water molecules are confined in the water-trapping layer (matrix). As a result, water is effectively prevented from being released out of the water-trapping layer. Thus the water-trapping layer that is forming the matrix of the ionic polymer and that contains the hygroscopic agent dispersed in the ionic polymer, features double functions of highly absorbing the moisture and trapping/confining the water therein. Therefore, the hygroscopic agent exhibits its excellent hygroscopic capability and helps further improve resistance against the swelling. Accordingly, the water-trapping layer exhibits very excellent hygroscopic property and resistance against the swelling (dimensional stability).

Further, as will be also understood from FIG. 2, the matrix that assumes the crosslinked structure suppresses an increase in the distance among the molecules of the ionic polymer despite water has infiltrated therein. Therefore, it is made possible to further effectively suppress the swelling caused by the absorption of water.

Cationic Polymer (a1);

In the invention, the cationic polymer (a1) favorably used as the matrix of the water-trapping layer 1 is a polymer having a cationic group that could become a positive electric charge in water, such as primary to tertiary amino group, quaternary ammonium group, pyridyl group, imidazole group or quaternary pyridinium group in the molecules thereof. The cationic polymer of this kind is capable of forming a hygroscopic matrix since the cationic group therein has a strong nucleophilic action and traps water by the hydrogen bond.

The amount of the cationic groups in the cationic polymer (a1) may, usually, be such that the water absorption (JIS K-7209-1984) of the hygroscopic matrix that is formed is 20% or more and, specifically, 30% to 45% in an atmosphere of a humidity of 80% RH and 30° C.

As the cationic polymer (a1), further, there can be used at least one kind of cationic monomer as represented by an amine type monomer, such as allylamine, ethyleneimine, vinylbenzyltrimethylamine, [4-(4-vinylphenyl)-methyl]-trimethylamine or vinylbenzyltriethylamine; a nitrogen-containing heterocyclic monomer such as vinylpyridine or vinylimidazole; or salts thereof, being suitably polymerized or copolymerized with other monomers copolymerizable therewith and, further, as required, being partly neutralized by the treatment with an acid.

As the other monomers copolymerizable therewith, though not limited thereto only, there can be exemplified styrene, vinyltoluene, vinylxylene, α-methylstyrene, vinylnaphthalene, α-halogenated styrenes, acrylonitrile, acrolein, methyl vinyl ketone and vinylbiphenyl.

Instead of using the above cationic monomer, further, it is also allowable to use a monomer having a functional group capable of introducing a cationic functional group, such as styrene, bromobutylstyrene, vinyltoluene, chloromethylstyrene, vinylpyridine, vinylimidazole, α-methylstyrene or vinyl naphthalene. After the polymerization, the treatment is executed such as amination or alkylation (conversion into a quaternary ammonium salt) to obtain the cationic polymer (a1).

In the invention, among the above cationic polymers (a1), it is desired to use, specifically, the polyallylamine from the standpoint of forming the film.

In the invention which uses the above cationic polymer (a1) as the matrix component, a certain kind of crosslinking agent is used to introduce a crosslinked structure in the matrix without, however, using any particular adhesive offering an advantage of improved adhesiveness to various kinds of base materials coated with the coating composition.

The polymerization for forming the cationic polymer (a1) is, usually, carried out based on the radical polymerization by heating while using a polymerization initiator.

As the polymerization initiator, though not specifically limited, there can be representatively used organic peroxides such as octanoyl peroxide, lauroyl peroxide, t-butylperoxy-2-ethyl hexanoate, benzoyl peroxide, t-butylperoxyisobutylate, t-butylperoxy laurate, t-hexylperoxy benzoate, and di-t-butyl peroxide. Usually, the polymerization initiator is used in an amount of about 0.1 to about 20 parts by mass and, specifically, about 0.5 and about 10 parts by mass per 100 parts by mass of the cationic monomer (or a monomer capable of introducing the cationic groups).

The cationic polymer (a1) is obtained by conducting the polymerization as described above. If there is used a monomer capable of introducing the cationic functional group, however, a treatment may be conducted for introducing cationic groups, such as amination or alkylation treatment after the polymerization has been finished.

Anionic Polymer (a2);

In the invention, the anionic polymer (a2) that is preferred for forming the matrix of the water-trapping layer 1 is a polymer which has in the molecules thereof an anionic functional group that could become a negative electric charge in water, such as carboxylic acid group, sulfonic acid group or phosphonic acid group, or an acid base thereof that is partly neutralized. The anionic polymer having such a functional group is capable of forming a hygroscopic matrix since the functional group therein traps water due to the hydrogen bond.

The amount of the anionic functional groups in the anionic polymer (a2) may differ depending on the kind of the functional groups but is, usually, such that the water absorption (JIS K-7209-1984) of the hygroscopic matrix that is formed is 20% or more and is, specifically, 30% to 45% in an atmosphere of a humidity of 80% RH and 30° C.

The anionic polymer (a2) having the above functional group is obtained by polymerizing or copolymerizing, with other monomers copolymerizable therewith, at least one of the anionic monomers as represented by carboxylic acid monomers such as methacrylic acid, acrylic acid and maleic anhydride; sulfonic acid monomers such as α-halogenated vinylsulfonic acid, styrenesulfonic acid and vinylsulfonic acid; phosphonic acid monomers such as vinylphosphoric acid, etc.; or salts of monomers thereof, followed, as required, by a partial neutralization with an alkali.

As the other monomers copolymerizable therewith, though not limited thereto only, there can be exemplified styrene, vinyltoluene, vinylxylene, α-methylstyrene, vinylnaphthalene, α-halogenated styrenes, acrylonitrile, acrolein, methyl vinyl ketone and vinylbiphenyl.

Instead of using the above anionic monomers, it is also allowable to obtain the anionic polymer (a2) by polymerizing an ester of the above anionic monomer or a monomer having a functional group capable of introducing the anionic functional group, such as styrene, vinyltoluene, vinylxylene, α-methylstyrene, vinylnaphthalene or α-halogenated styrenes followed by a treatment such as hydrolysis, sulfonation, chlorosulfonation or phosphoniation.

In the invention, a preferred example of the anionic polymer (a2) is a poly(meth)acrylic acid and a partly neutralized product thereof (e.g., the one which is partly an Na salt).

The polymerization for forming the anionic polymer (a2) is, usually, carried out based on the radical polymerization by heating while using a polymerization initiator.

As the polymerization initiator, though there is no particular limitation, there can be represented peroxides such as octanoyl peroxide, lauroyl peroxide, t-butylperoxy-2-ethyl hexanoate, benzoyl peroxide, t-butyl peroxyisobutylate, t-butyl peroxylaurate, t-hexyl peroxybenzoate and di-t-butyl peroxide. Usually, the polymerization initiator is used in an amount of about 0.1 to about 20 parts by mass and, specifically, about 0.5 to 10 parts by mass per 100 parts by mass of the above-mentioned anionic monomer (or the monomer capable of introducing anionic groups).

The anionic polymer (a2) is obtained through the polymerization as described above. However, if there is used the monomer capable of introducing the anionic functional groups, the treatment may be conducted for introducing the anionic groups, such as hydrolysis, sulfonation, chlorosulfonation or phosphoniation after the polymerization has been finished.

Forming the Water-trapping Layer 1;

The above water-trapping layer 1 can be formed by using a coating composition comprising a polymer for forming the matrix, e.g., cationic polymer (a1) or anionic polymer (a2), as well as the above-mentioned hygroscopic agent and, further, a crosslinking agent that are suitably dissolved or dispersed in a solvent. Namely, the water-trapping layer 1 is formed by applying the above composition followed by drying to remove the solvent.

The coating composition differs to some extent depending on when the cationic polymer (a1) is used as a polymer for forming the matrix or when the anionic polymer (a2) is used as a polymer for forming the matrix.

When the Cationic Polymer (a1) is Used;

The coating composition uses the hygroscopic agent in an amount as described above, i.e., in an amount of 50 to 1300 parts by mass per 100 parts by mass of the polymer (cationic polymer (a1)) that forms the matrix. In this case, the amount of the hygroscopic agent is, desirably, 100 to 800 parts by mass per 100 parts by mass of the cationic polymer (a1).

The coating composition is, further, suitably blended with a crosslinking agent to introduce a crosslinked structure into the hygroscopic matrix of the cationic polymer (a1).

As the crosslinking agent in this case, there can be preferably used a compound having a functional group (e.g., epoxy group) capable of reacting with the cationic group and a functional group (e.g., alkoxysilyl group) capable of forming a siloxane structure in the crosslinked structure through the hydrolysis and the dehydration/condensation. Specifically, there can be used a silane compound represented by the following formula (1):

$$X-SiR^1_n(OR^2)_{3-n} \quad (1)$$

wherein X is an organic group having an epoxy group at the terminal, $R^1$ and $R^2$ are, respectively, methyl groups, ethyl groups or isopropyl groups, and n is 0, 1 or 2.

The silane compound of the formula (1) has an epoxy group and an alkoxysilyl group as functional groups, and the epoxy group undergoes the addition reaction with a functional group (e.g., $NH_2$ group) of the cationic polymer. On the other hand, the alkoxysilyl group grows forming a silanol group (SiOH group) through the hydrolysis thereof and forming the siloxane structure through the condensation reaction thereof and, finally, forms the crosslinked structure among the cationic polymer chains. Therefore, the matrix of the cationic polymer (a1) has, introduced therein, the crosslinked structure that has the siloxane structure. On the other hand, the silanol group formed by the hydrolysis of the alkoxysilyl group undergoes the dehydration and condensation with the MOH group (M: metal element) present on the surface of the first inorganic barrier layer 3a that will be described later, such as SiOH group (silanol group), and strongly bonds thereto.

Besides, the coating composition contains the cationic polymer (a1) and is, therefore, alkaline. The coating composition, therefore, accelerates the addition reaction of the cationic group with the epoxy group and, further, accelerates the dehydration and condensation between the silanol groups or of the cationic group with the MOH group on the surface of the first inorganic barrier layer 3a.

By using the compound of the above formula (1) as the crosslinking agent, therefore, it is made possible to introduce the crosslinked structure into the matrix and to improve close adhesion between the water-trapping layer 1 and the first inorganic barrier layer 3a without using any particular adhesive.

As will be learned from the above description, if the siloxane structure is introduced into the crosslinked structure, then adhesiveness, too, is improved to the first inorganic barrier layer 3a.

In the invention, as the organic group X having the epoxy group in the above formula (1), there can be representatively used a γ-glycidoxyalkyl group. For instance, a γ-glycidoxypropyltrimethoxysilane or a γ-glycidoxypropylmethyldimethoxysilane is preferably used as the crosslinking agent.

There can be, further, favorably used a crosslinking agent in which the epoxy group in the above formula (1) is an alicyclic epoxy group like epoxycyclohexyl group. For instance, if there is used, as the cross linking agent, a compound that has an alicyclic epoxy group like β-(3,4-epoxycyclohexyl)ethyltrimethoxysilane, then an alicyclic structure is introduced together with the siloxane structure into the crosslinked structure of the matrix. Introduction of the alicyclic structure makes it possible to more effectively exhibit the function of the matrix which is to form a spatial mesh structure adapted for adsorbing the moisture.

In order to, further, introduce the alicyclic structure into the crosslinked structure, it is allowable to use, as the crosslinking agent, a compound that has a plurality of epoxy groups and alicyclic groups, e.g., a diglycidyl ester represented by the following formula (2):

$$G-O(C=O)-A-(C=O)O-G \quad (2)$$

wherein, G is a glycidyl group and A is a divalent hydrocarbon group having an aliphatic ring, such as cycloalkylene group.

A representative example of the diglycidyl ester is expressed by the following formula (2-1).

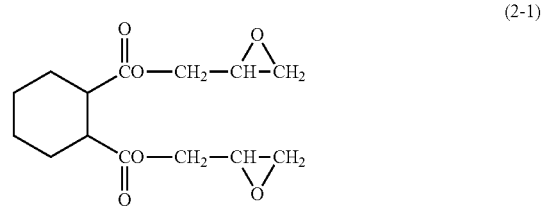

The diglycidyl ester of the formula (2) has no alkoxysilyl group and poorly works for improving the adhesiveness to the first inorganic barrier layer 3. However, use of the diglycidyl ester of the formula (2) as the crosslinking agent is effective in introducing the alicyclic structure into the crosslinked structure and in forming the spatial mesh structure in the matrix that is adapted for absorbing the moisture.

In the coating composition using the cationic polymer (a1) as a polymer for forming matrix, the above-mentioned crosslinking agent is used in an amount of, desirably, 5 to 60 parts by weight and, specifically, 15 to 50 parts by weight per 100 parts by weight of the cationic polymer (a1). Here, it is desired that at least 70% or more by weight and, preferably, 80% or more by weight of the crosslinking agent is the silane compound of the above formula (1).

If the crosslinking agent is used in too large amounts, the coating composition becomes mechanically brittle and less easy to handle. If the coating material is prepared, therefore, the viscosity increases so quickly that an effective pot life cannot be guaranteed. By using the crosslinking agent in too small amounts, on the other hand, it may become difficult to guarantee the durability (e.g., mechanical strength) if the coating is exposed to severe environmental conditions (e.g., highly humid conditions). Moreover, if the silane compound of the above formula (1) is used in too small amounts, the adhesiveness of the coating to the first inorganic barrier layer 3a may decrease.

As for the solvent used for the coating composition that contains the above-mentioned various kinds of components, there is no particular limitation provided it can be volatilized and removed upon heating at relatively low temperatures. For example, there can be used alcoholic solvents such as methanol, ethanol, propyl alcohol and butanol; ketone solvents such as acetone and methyl ethyl ketone; mixed solvents thereof with water; water; and aromatic hydrocarbon solvents such as benzene, toluene and xylene. In order to accelerate the hydrolysis of the silane compound having an alkoxysilyl group in the crosslinking agent in the coating composition, in particular, it is desired to use water or a mixed solvent containing water.

The above solvent is used in such an amount that the coating composition acquires a viscosity adapted to forming a coating thereof. Here, a non-ionic polymer can also be added in a suitable amount to adjust the viscosity of the coating composition or to adjust the water absorption of the formed hygroscopic matrix to lie in a suitable range.

As the non-ionic polymer, there can be exemplified saturated aliphatic hydrocarbon polymers such as polyvinyl alcohol, ethylene-propylene copolymer and polybutylene; styrene polymers such as styrene-butadiene copolymer, etc.; polyvinyl chloride; or the polymers thereof that are copolymerized with various kinds of comonomers (e.g., styrene monomers such as vinyltoluene, vinylxylene, chlorostyrene, chloromethylstyrene, α-methylstyrene, α-halogenated styrene, α,β,β'-trihalogenated styrene; monoolefins such as ethylene, butylene, etc.; and conjugated diolefins such as butadiene, isoprene, etc.).

When the Anionic Polymer (a2) is Used;

The coating composition for forming the water-trapping layer 1, in this case, uses the hygroscopic agent in an amount basically the same as that of when the cationic polymer (a1) is used. Specifically, however, the amount of the hygroscopic agent is 100 to 800 parts by mass per 100 parts by mass of the anionic polymer (a2).

The coating composition is, further, suitably blended with a crosslinking agent like when the above-mentioned cationic polymer (a1) is used.

As the crosslinking agent, there can be used a compound having two or more crosslinking functional groups (e.g., epoxy groups) capable of reacting with the anionic groups possessed by the anionic polymer (a2). Namely, there can be used the diglycidyl ester represented by the formula (2), i.e.,

G-O(C=O)-A-(C=O)O-G (2)

wherein, G is a glycidyl group, and A is a divalent hydrocarbon group having an aliphatic ring, such as cycloalkylene group, that was also used for the coating composition of when the cationic polymer (a1) was used.

In the digycidyl ester of the above formula (2), the epoxy group reacts with the anionic group, and the crosslinked structure that contains the alicyclic structure due to the divalent group A is formed in the matrix of the water-trapping layer 1. The crosslinked structure that contains the alicyclic structure works to further suppress the swelling.

Among the diglycidyl esters, preferred examples were mentioned above already. From the standpoint of forming a spatial mesh structure adapted to adsorbing moisture, in particular, it is most desired to use the diglycidyl ester represented by the above-mentioned formula (2-1).

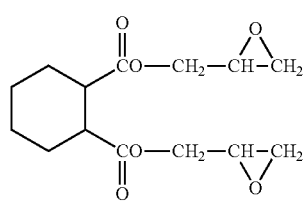

(2-1)

In the coating composition for forming the anionic matrix, the amount of the above-mentioned crosslinking agent is, desirably, 1 to 50 parts by weight and, specifically, 10 to 40 parts by weight per 100 parts by weight of the anionic polymer (a2). If the crosslinking agent is used in too large amounts, the coating may become mechanically brittle. Besides, if the coating composition is prepared, the viscosity increases so quickly that an effective pot life cannot be guaranteed. By using the crosslinking agent in too small amounts, on the other hand, it may become difficult to guarantee the durability (e.g., mechanical strength) if the coating is exposed to severe environmental conditions (e.g., highly humid conditions).

Further, the coating composition can be blended with an adhesive agent to improve the adhesiveness between the water-trapping layer 5 and the first inorganic barrier layer 3a.

Such an adhesive agent has functional groups that are reactive with the surface of the first inorganic barrier layer 3a and with the matrix of the anionic polymer (2a), and has, for example, an epoxy group and an alkoxysilyl group. For the coating composition for forming the cationic matrix, the silane compound used as the crosslinking agent works as an adhesive agent.

The silane compound is expressed by the above-mentioned formula (1): i.e., $$X—SiR^1{}_n(OR^2)_{3-n} \tag{1}$$

wherein X is an organic group having an epoxy group, $R^1$ and $R^2$ are, respectively, methyl groups, ethyl groups or isopropyl groups, and n is 0, 1 or 2.

That is, as described earlier, the silanol group (SiOH group) formed by the hydrolysis of the alkoxysilyl group undergoes the dehydration and condensation with the MOH (M is a metal element forming the inorganic barrier layer and is, for example, Si) that is distributed on the surface of the first inorganic barrier layer 3a. Therefore, the siloxane structure is introduced into the matrix and, due to the siloxane bond, the adhesive agent (silane compound) closely bonds to the surface of the first inorganic barrier layer 3a. Besides, the epoxy group bonds upon reacting (esterifying) with the acid group (e.g., COOH) possessed by the anionic polymer (a2). Therefore, adhesive agent bonds to the matrix of the water-trapping layer 1, too. Thus the adhesive agent improves the adhesion between the first inorganic barrier layer 3a and the water-trapping layer 1, improves the strength of junction and, as a result, effectively prevents the water-trapping layer 1 from peeling and maintains a high degree of water-barrier property over extended periods of time.

Specifically, if the first inorganic barrier layer 3a is a vapor-deposited film formed by the plasma CVD of an organic silicon compound as will be described later, the SiOH groups are distributed on the surface thereof, and siloxane bonds are easily formed between the water-trapping layer 1 (matrix) and the inorganic barrier layer 3a contributing greatly to improving the adhesiveness.

Of the silane compounds of the above formula (1), it is desired to use the one that has a plurality of alkoxysilyl groups (n is 0 or 1 in the formula (1)), such as γ-glycidoxypropyltrimethoxysilane or γ-glycidoxypropylmethyldimethoxysilane. As the adhesive agent, further, it is most desired to use the silane compound of which the epoxy group is an alicyclic epoxy group like epoxycyclohexyl group, such as β-(3,4-epoxycyclohexyl) ethyltrimethoxysilane.

In the present invention, the adhesive agent is used in an amount of, desirably 0.1 to 10 parts by weight and, specifically, 1 to 8 parts by weight per 100 parts by weight of the anionic polymer (a2) that forms the matrix in the water-trapping layer 1 so as to exhibit its properties to a sufficient degree without impairing the above-mentioned water-barrier property.

As the solvent used for the coating composition that contains the above-mentioned various kinds of components, there is no specific limitation if it can be volatilized and removed by heating at a relatively low temperature, and there can be used the same solvents as those exemplified for the coating composition that uses the cationic polymer (a1). Specifically, if the silane compound having an alkoxysilyl group is used as the adhesive agent like the compound of the above formula (1), it is desired to use a solvent which at least contains water. This is to accelerate the hydrolysis of the alkoxysilyl groups and to improve the function as the crosslinking agent or the adhesive agent.

The coating composition which uses the above anionic polymer (a2) as a material for forming the matrix can be, further, added with an alkali (e.g., sodium hydroxide) for adjusting the pH. Addition of the alkali is effective in accelerating the dehydration/condensation of the silanol group formed from the silane compound used as the adhesive agent with the MOH group on the surface of the inorganic barrier layer 3. It is desired that the alkali is added such that the pH becomes about 8 to about 12.

The above-mentioned solvent is used in such an amount that the coating composition assumes a viscosity adapted to being applied like the coating composition for forming the cationic matrix. Moreover, the above-mentioned non-ionic polymer can be added to the coating composition in a suitable amount in order to adjust the viscosity thereof or to adjust the water absorption of the formed hygroscopic matrix to lie in a suitable range.

The water-trapping layer 1 is formed by using the above coating composition. Namely, the coating composition is applied onto the surface of the first inorganic barrier layer 3a and is heated at a temperature of about 80 to about 160° C. The heating time is, usually, from several seconds to several minutes though it varies on the capability of the heating device such as heating oven. The solvent is removed by heating, and the crosslinking agent reacts with the ionic polymer that forms the matrix and with the MOH on the surface of the first inorganic barrier layer 3a, whereby the crosslinked structure is introduced into the matrix and, besides, the water-trapping layer 1 is formed featuring excellent adhesiveness to the first inorganic barrier layer 3a.

The thickness of the water-trapping layer 1 thus formed is not specifically limited and may be suitably set depending on the use and the degree of water-barrier property. For example, to realize such a super-barrier property that the water vapor permeability is $10^{-5}$ g/m$^2$/day or less over extended periods of time, the thickness thereof should be at least 1 μm or more and, specifically, about 2 to about 20 μm.

The water-trapping layer 1, according to the invention, is formed as described above, i.e., contains, dispersed therein, the hygroscopic agent that exhibits a high hygroscopic capability under highly humid conditions, and has the structure of being sandwiched by the inorganic barrier layers 3a and 3b. Therefore, the water-trapping layer 1 exhibits its excellent water-barrier property over extended periods of time. Besides, in case the matrix of the water-trapping layer 1 is formed by using the ionic polymer (cationic polymer (a1)) or the anionic polymer (a2), the water-trapping layer 1 exhibits double functions of absorbing water and confining water. It is, therefore, made possible to realize the above-mentioned super-barrier property against water over extended periods of time.

<Inorganic Barrier Layers 3a and 3b>

In the invention, the inorganic barrier layers 3a and 3b that work to sandwich the water-trapping layer 1 are basically the inorganic films formed by the physical deposition as represented by sputtering, vacuum deposition or ion plating, by the chemical deposition as represented by plasma CVD or ALD method (atomic layer deposition method), or by the sol-gel coating method by using various metals or metal oxides in order to maintain the laminate 10 transparent. Specifically, however, the inorganic barrier layers 3a and 3b are deposited by the plasma CVD so as to be uniformly formed even on rugged surfaces yet maintaining a high degree of adhesiveness to the underlying layer (plastic base material 5 or the organic layer 7) while exhibiting excellent barrier property.

To form the films by the plasma CVD, the plastic base material 5 that serves as an underlying layer for the first inorganic barrier layer 3a or the organic layer 7 that serves as the underlying layer for the second inorganic barrier layer 3b is arranged in a plasma-treating chamber maintained under a predetermined degree of vacuum, a gas (reaction gas) of a metal for forming the film or of a compound of the metal and an oxidizing gas (usually, oxygen or NOx gas) are suitably fed together with a carrier gas such as argon or helium into the plasma-treating chamber shielded with a metal wall and in which the pressure is reduced down to a predetermined degree of vacuum through a gas feed pipe. In this state, a glow discharge is generated in a microwave electric field or in a high-frequency electric field to generate a plasma by utilizing the electric energy therein, whereby the decomposition reaction product of the above compound is deposited on the surface of the underlying plastic base material 5 and the organic layer 7 so as to form films thereon.

When the microwave electric field is utilized, the microwaves are applied into the plasma-treating chamber by using a waveguide to form the films. When the high-frequency electric field is utilized, the plastic base material 1 in the plasma-treating chamber is positioned between a pair of electrodes, and the high-frequency electric field is applied to the electrodes to form the films.

As the reaction gas, in general, it is desired to use a gas of an organometal compound such as an organoaluminum compound like trialkylaluminum, or an organotitanium compound, organozirconium compound or organosilicon compound from the standpoint of forming, on the surface of the plastic material, a film having a flexible region containing carbon and, further, having thereon a region that is highly oxidized and has excellent barrier property. In particular, it is most desired to use the organosilicon compound from the standpoint of relatively easily and efficiently forming the inorganic barrier layers 3a and 3b having a high degree of barrier property against oxygen.

As the organosilicon compound, there can be used organosilane compounds such as hexamethyldisilane, vinyltrimethylsilane, methylsilane, dimethylsilane, trimethylsilane, diethylsilane, propylsilane, phenylsilane, methyltriethoxysilane, vinyltriethoxysilane, vinyltrimethoxysilane, tetramethoxysilane, tetraethoxysilane, phenyltrimethoxysilane, methyltrimethoxysilane and methyltriethoxysilane, as well as organosiloxane compounds such as octamethylcyclotetrasiloxane, 1,1,3,3-tetramethyldisiloxane and hexamethyldisiloxane. There can be, further, used aminosilane, silazane and the like, as a matter of course.

The above-mentioned organic metal compounds can be used either in a single kind or in a combination of two or more kinds.

In forming the film by the plasma CVD by using the reaction gas of the above-mentioned organometal compound and an oxidizing gas according to the present invention, it is desired that the film is formed by the plasma reaction with a small glow discharge output (e.g., microwave output or high-frequency output) at first and, thereafter, with a large glow discharge output.

That is, organic groups ($CH_3$, $CH_2$, etc.) contained in the molecules of the organometal compound, usually, volatilize as $CO_2$. Here, if the output is small, part of the organic groups are not decomposed into $CO_2$ but deposits on the surface of the underlying plastic base material 5 or the organic layer 7 (hereinafter, they are often called underlying materials) and remains contained in the film. As the output increases, on the other hand, the organic groups are decomposed into $CO_2$. Upon increasing the output, therefore, it is made possible to form the film of a highly oxidized metal that is contained in the organometal compound while decreasing the amount of carbon in the film. The film of a highly oxidized metal has a very high degree of barrier property against gases such as oxygen and the like but has poor flexibility and does not adhere to the underlying materials to a sufficient degree. On the other hand, the film of a lowly oxidized metal and containing much organic component does not have a high degree of barrier property against gases but is rich in flexibility and highly closely adheres to the underlying materials.

According to the present invention as will be understood from the above description, the film is, first, formed by the plasma CVD by using the organometal compound as the reaction gas and with a small output. The film is, thereafter, formed by increasing the output to form a highly adhesive region containing much organic component (carbon) on the portion that comes in contact with the surfaces of the underlying materials and to form, thereon, a region of a highly oxidized metal having a high degree of gas-barrier property.

In order to maintain excellent gas-barrier property, therefore, if the degree of oxidation of a metal (M) is denoted by x (atomic ratio x=O/M), it is desired that the first inorganic barrier layer 3a and the second inorganic barrier layer 3b in the water-barrier laminate 10 of the present invention include a highly oxidized region in which the degree of oxidation x is 1.5 to 2.0. On the lower side of the highly oxidized region (on the side coming in contact with the surfaces of the underlying materials), further, it is desired that there is formed an organic region where the carbon (C) concentration is 20 atomic % or higher on the basis of the three elements of metal (M), oxygen (O) and carbon (C). Further, the metal (M) is preferably silicon (Si).

It is desired that the highly oxidized regions in the inorganic barrier layers 3a and 3b are present in a thickness of 60% or more of the whole thickness of the inorganic barrier layer 3a or 3b. It is, further, desired that the above organic regions are formed in a thickness of about 5 to about 40% of the whole thickness of the inorganic barrier layer 3a or 3b on the sides that come in contact with the underlying materials.

In forming the first inorganic barrier layer 3a and the second inorganic barrier layer 3b having the above-mentioned organic region and the highly oxidized region by the plasma CVD, the glow discharge output differs to some extent depending upon if microwaves are used or high-frequency waves are used. If microwaves are used, for example, the organic regions are formed with a low output of about 30 to about 100 W and the highly oxidized regions are formed with a high output of 90 W or more. Further, if high-frequency waves are used, the organic regions are formed with a low output of about 20 to about 80 W and the highly oxidized regions are formed with a high output of 100 W or more.

The film-forming time may be so set that the thicknesses of the regions lie within the ranges mentioned above.

The whole thicknesses of the first inorganic barrier layer 3a and the second inorganic barrier layer 3b, sandwiching the water-trapping layer 1, may be so set as to suppress water that has been adsorbed from being released, and are, usually, 1 to 1200 nm and, specifically, 4 to 1000 nm, respectively.

<Plastic Base Material 5>

In the invention, the plastic base material 5 that is the underlying layer of the first inorganic barrier layer 3a is made of a plastic material such as thermoplastic or thermosetting resin that is known per se.

As the resin, though not limited thereto only, there can be exemplified polyolefins or cyclic olefin copolymers such as random or block copolymers of α-olefins, like low-density polyethylene, high-density polyethylene, polypropylene, poly (1-butene), poly (4-methyl-1-pentene) and random or block copolymers of α-olefins such as ethylene, propylene, 1-butene or 4-methyl-1-pentene and cyclic olefin copolymers thereof; ethylene-vinyl compound copolymers such as ethylene-vinyl acetate copolymer, ethylene-vinyl alcohol copolymer, and ethylene-vinyl chloride copolymer;

styrene resins such as polystyrene, acrylonitrile-styrene copolymer, ABS, and α-methylstyrene-styrene copolymer;

vinyl resins such as polyvinyl chloride, polyvinylidene chloride, vinyl chloride-vinylidene chloride copolymer, methyl polyacrylate and methyl polymethacrylate;

polyamides such as nylon 6, nylon 6-6, nylon 6-10, nylon 11 and nylon 12;

thermoplastic polyesters such as polyethylene terephthalate (PET), polybutylene terephthalate and polyethylene naphthalate (PEN);

polycarbonates;

polyphenylene oxides;

biodegradable resins such as polyimide resin, polyamideimide resin, polyetherimide resin, fluorine-contained resin, allyl resin, polyurethane resin, cellulose resin, polysulfone resin, polyethersulfone resin, ketone resin, amino resin and polylactic acid;

as well as blends thereof, those resins suitably modified by being copolymerized, or multilayered structures thereof.

In case transparency is required, it is, specifically, desired to use a polyester resin such as PET or PEN among them. In case heat resistance, too, is required, it is desired to use a polycarbonate or a polyimide resin.

The above resins may be blended with known blending agents such as antioxidant, lubricant, etc., as a matter of course.

There is no specific limitation on the form of the plastic base material 5 if it can exhibit barrier property against water to a sufficient degree. Namely, the plastic base material 5 may assume any suitable form to meet the use but, most generally, assumes the form of a plate, a film or a sheet.

The thickness thereof is set to lie in a suitable range depending upon the requirements (e.g., flexibility, softness, strength, etc.) to meet the use.

Depending on its form and the kind of the plastic material, the plastic base material 5 is formed by a known forming means such as injection or co-injection forming, extrusion or co-extrusion forming, film or sheet forming, compression forming, or cast polymerization.

<Organic Layer 7>

In the invention, the organic layer 7 that is the underlying layer for the second inorganic barrier layer 3b, is formed on the water-trapping layer 1.

The water-trapping layer 1 undergoes a change in the volume to a very small degree as it absorbs moisture. The second inorganic barrier layer 3b can be directly formed on the water-trapping layer 7 by the CVD or the like method. In this case, however, the adhesiveness decreases between the second inorganic barrier layer 3b and the water-trapping layer 1, and delamination may take place easily. To avoid a decrease in the adhesiveness, it is desired to form the organic layer 7 on the water-trapping layer 1 to serve as the underlying layer for the second inorganic barrier layer 3b.

The second inorganic barrier layer 3b unavoidably contains defects such as pinholes and cracks. Water flows locally and in a concentrated manner into the water-trapping layer 1 through the defects causing the water-barrier property of the water-trapping layer 1 to be locally deteriorated. In the present invention, however, the organic layer 7 is made present between the second inorganic barrier layer 3b and the water-trapping layer 1. Therefore, a very small amount of water that has passed through the defects in the second inorganic barrier layer 3b, permeates through the organic layer 7 in a manner of being dispersed therein. As a result, the water uniformly disperses over the whole water-trapping layer 1 in the direction of surface thereof; i.e., the water-trapping layer 1 as a whole exhibits water-trapping property and effectively avoids such an inconvenience that its water-barrier property is locally deteriorated.

The organic layer 7 can be formed by using any resin provided it is capable of forming a film that has a smooth surface and a property of not absorbing moisture (e.g., having a water absorption (80% RH, 30° C.) of 1.0% or less) and is capable of maintaining a highly adhering force (e.g., 1.0 N/15 mm or more) to the water-trapping layer 1. Usually, however, it is desired that the organic layer 7 is formed by using a resin having a glass transition temperature (Tg) of 60° C. or more from the standpoint of preventing the thermal deformation of the second inorganic barrier layer 3b of when it is being formed and that the organic layer 7 itself can be easily formed by being applied on the water-trapping layer 1.

As the resin for forming the organic layer 7, from the above point of view, there can be exemplified polyester resin, cycloolefin resin, (meth)acrylic resin and halogen resin, and from which is selected a resin having a high glass transition point (Tg) as described above.

Representative examples of the polyester resin include polyethylene terephthalate (PET), polybutylene terephthalate and polyethylene naphthalate, and all of which may contain a copolymer unit.

Representative examples of the dibasic acid component in the copolymer unit include aromatic dicarboxylic acids such as isophthalic acid, phthalic acid and naphthalenedicarboxylic acid; alicyclic dicaroxylic acids such as cyclohexanedicarboxylic acid and the like acid; and aliphatic dicarboxylic acids such as succinic acid, adipic acid, sebacic acid and dodecanedioic acid. As the diol component, further, there can be exemplified propylene glycol, 1,4-butanediol, diethylene glycol, 1, 6-hexylene glycol, cyclohexanedimethanol and ethylene oxide adduct of bisphenol A, which can be used in one kind or in two or more kinds.

As the cycloolefin resin, further, there can be exemplified a polycyclohexene derived from the cyclohexene, as well as those derived from the olefin (polycyclic olefin) having a bicyclo ring with a crosslinked group (e.g., methylene group or ethylene group) in the cyclohexane ring or having a polycyclic structure in which an aliphatic ring is further bonded to the bicyclo ring.

As the polycyclic olefin, there can be exemplified those having a bicyclo-ring structure represented by the following formula (3):

(3)

wherein Z is a methylene group or an ethylene group.

Described below are concrete examples of the polycyclic olefin though not limited thereto only.

 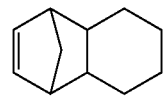

Bicyclo[2.2.1]hepto-2-en  Tricyclo[4.4.0.1$^{2.5}$]-3-undecene

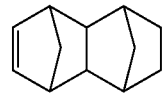

Tetracyclo[4.4.0.1$^{2.5}$.1$^{7.10}$]-3-dodecene

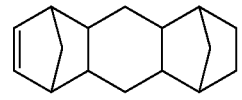

Pentacyclo[8.4.0.1$^{2.5}$.1$^{9.12}$.0$^{8.13}$]-3-hexadecene

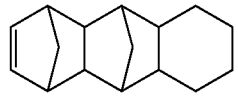

Pentacyclo[6.6.1.1$^{3.6}$.0$^{2.7}$.0$^{9.14}$]-4-hexadecene

As the (meth)acrylic resin, further, there can be exemplified those obtained by polymerizing the following mono (meth)acrylate monomers and polyfunctional (meth)acrylate monomers in one kind or in a combination of two or more kinds.

1. Mono(meth)acrylate monomers;
   methyl(meth)acrylate,
   ethyl(meth)acrylate,
   glycidyl(meth)acrylate,
   2-cyanomethyl(meth)acrylate,
   benzyl(meth)acrylate,
   polyethylene glycol mono(meth)acrylate,
   allyl(meth)acrylate,
   2-hydroxyethyl(meth)acrylate,
   glycidyl(meth)acrylate,
   3-hydroxypropyl(meth) acrylate,
   glycerylmono(meth)acrylate, and
   2-(meth)acryloxyethylacetyl acetate.
2. Polyfunctional (meth)acrylate monomers;
   ethylene glycol di(meth)acrylate,
   diethylene glycol di(meth)acrylate,
   triethylene glycol di(meth)acrylate,
   nonaethylene glycol di(meth)acrylate,
   propylene glycol di(meth)acrylate,
   dipropylene glycol di(meth)acrylate,
   2,2'-bis[4-(meth)acryloyloxyethoxyphenyl]propane, 2,2'-bis[4-(meth)acryloyloxyethoxyethoxy phenyl]propane,
2,2'-bis{4-[3-(meth)acryloyloxy-2-hydroxy propoxy] phenyl}propane,
1,4-butanedioldi(meth)acrylate,
1,6-hexanedioldi(meth)acrylate,
trimethylolpropanetri(meth)acrylate,
urethane(meth)acrylate, and
epoxy(meth)acrylate.

In addition to the above, there can be used polymers obtained by, for example, polymerizing a long-chain alkyl ester (e.g., having 3 carbon atoms or more) of a (meth) acrylic acid. However, the polymers of this kind have considerably low glass transition temperature (Tg) and are, usually, used in the form of a copolymer with a polyfunctional (meth)acrylate.

As the halogen resin, there can be exemplified vinyl chloride resin, vinylidene chloride resin, chlorinated vinyl chloride resin, tetrafluorinated resin (polytetrafluoroethylene), vinylidene fluoride resin, chlorotrifluoroethylene resin (PCTFE), vinyl fluoride resin (PVF), perfluoroalkoxyfluorine resin (PFA), ethylne-ethylene tetrafluoride copolymer resin (ETFE), and ethylene-chlorotrifluoroethylene copolymer resin (ECTFE).

In the present invention, the organic layer 7 is formed by dissolving the above-mentioned resins in a volatile organic solvent, and applying the thus prepared coating solution onto the water-trapping layer 1 followed by drying. The organic layer 7 can be also formed by separately forming a film or a sheet that corresponds to the organic layer 7, and sticking the film or the sheet by using a suitable adhesive agent onto the water-trapping layer 1 by dry lamination. In this case, the second inorganic barrier 3b may have been formed in advance on the film or the sheet that forms the organic layer 7, as a matter of course.

Irrespective of by which method the organic layer 7 is to be formed, it is desired that the water-trapping layer 1 is formed on the first inorganic barrier layer 3a and, thereafter, the operation is continued to form the organic layer 7. This is because as the water-trapping layer 1 continues to be exposed in the atmosphere for extended periods of time, its activity decreases due to the absorption of moisture.

Further, the organic layer 7 is capable of dispersing water that has permeated therein. If used, for example, as a layer for sealing an organic EL device, the second inorganic barrier layer may be brought to be positioned on the outer side of the device. In this case, water permeates into the second inorganic barrier layer and then permeates into the water-trapping layer 1 after having been uniformly dispersed via the organic layer 7. Therefore, the hygroscopic agent exhibits its capability to a maximum degree.

The organic layer 7 should have such a thickness that does not permit a very small change in the volume of the water-trapping layer 1 caused by the absorption of moisture to be reflected in the surface of the organic layer 7. An unnecessarily increased thickness, however, simply results in disadvantage in economy. By taking the above respects into account, the thickness of the organic layer 7 is, usually, set to be about 1 to about 200 μm and, specifically, about 2 to about 100 μm.

<Other Layers>

In the invention, there is no need of providing any particular layer on the above second inorganic barrier layer 3b. It is, however, also allowable to form any known layer that has heretofore been formed for the gas-barrier laminates of this kind in a range in which it does not impair the advantage of the present invention.

For example, there can be formed a water-repellent layer such as olefin resin layer in order to reliably prevent the release of water from the water-trapping layer 1 and to avoid a decrease in the electric insulation caused by water that is released. The water-repellent layer can be also formed on the water-trapping layer 1.

In order to further improve barrier property against oxygen, there can be provided an oxygen-barrier layer comprising an ethylene-vinyl alcohol copolymer or aromatic polyamide, or an oxygen-absorbing layer that contains a transition metal such as iron, cobalt or the like.

The above-mentioned layers can be easily formed by known means, such as co-extrusion, coating or the like method.

<Use>

The gas-barrier laminate 10 of the present invention includes the water-trapping layer 1 that exhibits very excellent water-trapping capability, maintains its water-barrier property over extended periods of time, prevents a change in the size thereof caused by the absorption of moisture, and effectively avoids a decrease in the adhesiveness (that causes a decrease in the barrier property) caused by a change in the size.

Therefore, the gas-barrier laminate 10 can be favorably used as a film for sealing various kinds of electronic devices or electronic circuits such as organic EL devices, solar cells and e-papers. Further, if there is used a plastic film material 5 having excellent transparency such as of PET, PEN, polycarbonate or polyimide resin, it is allowed to form transparent electrodes thereon and to form, thereon, an organic EL device having a luminous layer or a photovoltaic device of a solar cell.

EXAMPLES

Excellent properties of the water-barrier laminate of the invention will now be described below by way of Examples.

<Evaluating the Attained Humidity>

The water-barrier laminate was dried at 140° C. for one hour. 0.5 g of the material to be measured and a wireless thermometer/hygrometer (Hygroclone, manufactured by KN Laboratories, Inc.) were put into a cup of a water-impermeable steel-foiled laminate having a volume of 85 $cm^3$ in an atmosphere of 30° C. 80% RH. The mouth of the container was heat-sealed with a lid of an aluminum foil-laminated film. After left to stand at 30° C. for one day, the relative humidity in the container was regarded as the attained humidity.

<Measuring the Water Vapor Permeability ($g/m^2$/Day)>

In compliance with the method described in JP-A-2010-286285, measurement was taken as describe below.

By using a vacuum evaporation apparatus (JEE-400 manufactured by JEOL Ltd.), a thin Ca film (thin film of a metal that corrodes with water) was formed by vacuum evaporation in a thickness of 300 nm on the surface of the inorganic barrier layer of the sample water-barrier laminate. Further, an Al film (water-impermeable thin metal layer) was vapor-deposited in a thickness of 540 nm so as to cover the thin Ca film to thereby prepare a sample piece.

Here, the thin Ca film was vapor-deposited in a circular shape 1 mm in diameter on six places by using metal calcium as a source of vacuum evaporation and by using a predetermined mask. Thereafter, the mask was taken away in a vacuum state, and Al was vapor-deposited thereon from an Al vacuum evaporation source in the apparatus.

The thus formed sample was placed in a gas-impermeable cup filled with the silica gel (moisture absorbing capability of 300 mg/g) as the hygroscopic agent, and was fixed therein by using a fixing ring to prepare a unit for evaluation.

The thus prepared unit for evaluation was held in an air-conditioned vessel adjusted to an atmosphere of 40° C. 90% for 520 to 720 hours. Thereafter, by using a laser microscope (laser scan microscope manufactured by Carl. Zeiss Microscopy GmbH.), the thin Ca film of the sample was observed for its state of corrosion, and the water vapor permeability was calculated from the amount of the metal calcium that was corroded. The evaluation was made on the following basis.

⊚: The water vapor permeability was $10^{-5}$ g/m²/day or less.
◯: The water vapor permeability was more than $10^{-5}$ g/m²/day but was less than $10^{-3}$ g/m²/day.
X: The water vapor permeability was $10^{-3}$ g/m²/day or more.

<Measuring an Increase in the Water Content>

An increase in the water content in the water-trapping layer of the water-barrier laminate was found according to the procedure described below.

The sample water-barrier laminate was prepared and was left to stand in an atmosphere of 22° C. 60% RH for 3 months. Thereafter, the sample was measured for its water content W1 by using an apparatus for measuring trace amounts of water (Model CA-06, manufactured by Mitsubishi Chemical corporation.).

Figure 8:
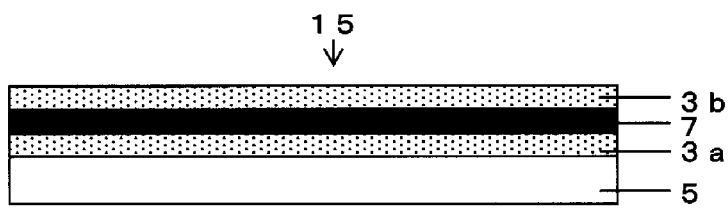
FIG. 8 is a sectional view schematically illustrating the structure of layers of a water-barrier laminate from which the water-trapping layer 1 is removed.

Similarly, there were prepared a laminate without the second inorganic barrier layer 3b (see FIG. 6) and a laminate without the water-trapping layer 1 (see FIG. 8). The samples were left to stand in an atmosphere of 22° C. 60% RH for 3 months. Thereafter, the samples were measured for their water contents W2 and W3.

A water content Wa in the water-trapping layer 1 was calculated from W1-W3.

A water content Wb in the water-trapping layer 1 was calculated from W2-W3.

An increase in the water content in the water-trapping layer 1 was calculated from Wa/Wb.

From the above measured values, the water contents were evaluated on the following basis.

◯: Wa/Wb is 1.1 or more.
X: Wa/Wb is less than 1.1.

<Measuring the Hygroscopic Ratios>

Hygroscopic ratios of the water-trapping layers of the water-barrier laminates were found according to the procedure described below.

The hygroscopic agent was put in an aluminum laboratory dish. The weight of the hygroscopic agent after it was dried at 140° C. for one hour was denoted by Z. The weight of the hygroscopic agent after it was left to stand in an atmosphere of 30° C. 80% RH for 2 hours was denoted by X. The hygroscopic amount Ax in 30° C. 80% RH was calculated from (X–Z)/Z.

The weight of the hygroscopic agent after it was left to stand in an atmosphere of 30° C. 30% RH for 2 hours was denoted by Y, and the hygroscopic amount Ay in 30° C. 30% RH was calculated from (Y–Z)/Z.

From the calculated values, the hygroscopic ratios Ax/Ay were calculated and were evaluated on the following basis.

◯: The hygroscopic ratio Ax/Ay is 3 or more.
X: The hygroscopic ratio Ax/Ay is less than 3.

<Preparation of a Polyethylene Terephthalate (PET) Film Coated with the First Inorganic Barrier Layer 3a>

By using a plasma CVD apparatus, an inorganic barrier layer 3a of silicon oxide was formed on one surface of a biaxially stretched PET film 1 having a thickness of 100 µm. Described below were the conditions for preparing the film.

There was used a CVD apparatus equipped with a high-frequency output power source of a frequency of 27.12 MHz and a maximum output of 2 kW, a matching box, a metallic cylindrical plasma-treating chamber of a diameter of 300 mm and a height of 450 mm, and a hydraulic rotary vacuum pump for evacuating the treating chamber. A plastic base member was placed on flat parallel plates in the treating chamber, a hexamethyldisiloxane was introduced at a rate of 3 sccm, oxygen was introduced at a rate of 45 sccm, and a 50-watt high-frequency output was generated by the high-frequency oscillator for 2 seconds to form a closely adhered layer. Next, a 200-watt high-frequency output was generated by the high-frequency oscillator for 100 seconds to form a barrier layer. The thus obtained inorganic barrier layer-coated PET film exhibited a water vapor permeability of 1 to $3 \times 10^{-3}$ g/m²/day as measured in an atmosphere of 40° C. 90% RH.

<Preparation of the Second Inorganic Barrier Layer 3b>

By using a plasma CVD apparatus, an inorganic barrier layer 3b of silicon oxide was formed on an organic layer 7. Described below were the conditions for preparing the film.

There was used the CVD apparatus equipped with the high-frequency output power source of a frequency of 27.12 MHz and a maximum output of 2 kW, the matching box, the metallic cylindrical plasma-treating chamber of a diameter of 300 mm and a height of 450 mm, and the hydraulic rotary vacuum pump for evacuating the treating chamber. A plastic base member was placed on flat parallel plates in the treating chamber, the hexamethyldisiloxane was introduced at a rate of 3 sccm, oxygen was introduced at a rate of 45 sccm, and a 50-watt high-frequency output was generated by the high-frequency oscillator for 2 seconds to form a closely adhered layer. Next, a 100-watt high-frequency output was generated by the high-frequency oscillator for 50 seconds to form an inorganic barrier layer 3b that exhibited a water vapor permeability of 1 to $2 \times 10^{-1}$ g/m²/day as measured in an atmosphere of 40° C. 90% RH.

Example 1

As the ionic polymer and the hygroscopic agent, there were provided the following polyallylamine (cationic polymer) and the hygroscopic agent.

Polyallylamine;
  PAA-15C (aqueous solution) manufactured by Nittobo Medical Co., Ltd.
  Solid component: 15% by weight
Hygroscopic agent;
  Crosslinked product of Na polyacrylate.
  TAFTIC HU-820E (aqueous dispersion) manufactured by Toyobo Co., Ltd.
  Solid component: 13% by weight A polymer solution was obtained by diluting, as the ionic polymer, the above polyallylamine with water such that the solid component was 5% by weight.

On the other hand, a solution of the crosslinking agent was prepared by dissolving a γ-glycidoxypropyltrimethoxysilane, as the crosslinking agent, in water such that the amount thereof was 5% by weight.

Next, the polymer solution and the solution of the crosslinking agent were mixed together such that the amount of the γ-glycidoxypropyltrimethoxysilane was 15 parts by weight per 100 parts by weight of the polyallylamine. To the mixed solution was, further, added, the above hygroscopic agent (crosslinked product of Na polyacrylate) in an amount of 400 parts by weight with respect to the polyallylamine, and to which was, further, added water such that the amount of the solid component was 5%. The mixture was stirred well to obtain a coating solution A for forming the water-trapping layer.

By using a bar coater, the above coating solution A was applied onto the vapor-deposited surface of the inorganic barrier layer 3a-coated PET film that has been prepared in advance. The film after applied with the coating solution was heat-treated in a box-type electric oven under the conditions of a peak temperature of 120° C. and a peak temperature-holding time of 10 seconds. There was formed a water-trapping layer 1 of a thickness of 4 μm to obtain a coating film A.

A coating solution B for forming an organic layer was prepared by dissolving a polyester resin (VYLON GK880 manufactured by Toyobo Co.) in a 2-butanone such that the amount of the solid component was 10% by weight.

By using the bar coater, the above coating solution B was applied onto the water-trapping layer 1 of the coating film A obtained above immediately after the water-trapping layer has been formed. The film after applied with the coating solution was heat-treated in the box-type electric oven under the conditions of a peak temperature of 120° C. and a peak temperature-holding time of 10 seconds. There was formed the organic layer 7 of a thickness of 4 μm to obtain the coating film B.

Next, by using the plasma CVD apparatus, an inorganic barrier layer 3b was quickly formed on the organic layer 7 of the coating film B. There was obtained a gas-barrier laminate of a layer structure as shown in FIG. 1.

Example 2

By using an ion-exchange resin (Amberlite 200CT manufactured by Organo Corporation), the Na salt type carboxyl group of the crosslinked product (HU-820E) of the Na polyacrylate was transformed into the H type carboxyl group. Thereafter, by using a 1N aqueous solution of potassium hydroxide, there was obtained a crosslinked product of the K polyacrylate having the potassium salt type carboxyl group (aqueous dispersion, solid component: 10%, average grain size: 68 nm, neutralization ratio: 80%).

A water-barrier laminate 10 was obtained in the same manner as in Example 1 but using the above crosslinked product of the K polyacrylate as the hygroscopic agent.

Example 3

By using the ion-exchange resin (Amberlite 200CT manufactured by Organo Corporation), the Na salt type carboxyl group of the crosslinked product (HU-820E) of the Na polyacrylate was transformed into the H type carboxyl group. Thereafter, by using a 1N aqueous solution of lithium hydroxide, there was obtained a crosslinked product of the Li polyacrylate having the lithium salt type carboxyl group (aqueous dispersion, solid component: 10%, average grain size: 65 nm, neutralization ratio: 80%).

A water-barrier laminate 10 was obtained in the same manner as in Example 1 but using the above crosslinked product of the Li polyacrylate as the hygroscopic agent.

Example 4

By using the ion-exchange resin (Amberlite 200CT manufactured by Organo Co.), the Na salt type carboxyl group of the crosslinked product (HU-820E) of the Na polyacrylate was transformed into the H type carboxyl group. Thereafter, by using a 1N aqueous solution of cesium hydroxide, there was obtained a crosslinked product of the Cs polyacrylate having the cesium salt type carboxyl group (aqueous dispersion, solid component: 10%, average grain size: 80 nm, neutralization ratio: 80%).

A water-barrier laminate 10 was obtained in the same manner as in Example 1 but using the above crosslinked product of the Cs polyacrylate as the hygroscopic agent.

Example 5

Figure 4:
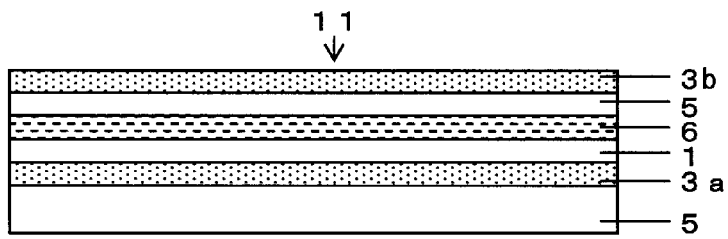
FIG. 4 is a sectional view schematically illustrating the structure of layers of a water-barrier laminate fabricated in Example 5.

A coating film A was formed in the same manner as in Example 1, and was quickly transferred into a gloved box in which the nitrogen concentration has been adjusted to be 99.95% or more. The PET film of a thickness of 12 μm that corresponds to the thickness of the organic layer 7 and having the inorganic barrier layer 3b formed on one surface thereof, was dry-laminated on the water-trapping layer 1 of the coating film A via the urethane type adhesive layer 6 of a thickness of 4 μm in a manner that the inorganic barrier layer 3b was on the outer side. In order to cure the adhesive resin layer so will not to absorb moisture, the laminate was aged in vacuum at 50° C. for 3 days. There was obtained a water-barrier laminate 11 of a layer structure as shown in FIG. 4.

Example 6

Figure 5:
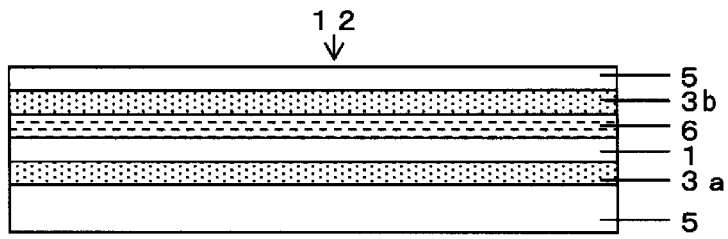
FIG. 5 is a sectional view schematically illustrating the structure of layers of a water-barrier laminate fabricated in Examples 6.

A coating film A was formed in the same manner as in Example 1, and was quickly transferred into the gloved box in which the nitrogen concentration has been adjusted to be not less than 99.95%. The PET film of a thickness of 12 μm and having the inorganic barrier layer 3b formed on one surface thereof, was dry-laminated on the water-trapping layer 1 of the coating film A via the urethane type adhesive layer 6 of a thickness of 4 μm in a manner that the inorganic barrier layer 3b was in contact with the urethane type adhesive layer 6. In order to cure the adhesive resin layer so will not to absorb moisture, the laminate was aged in vacuum at 50° C. for 3 days. There was obtained a water-barrier laminate 12 of a layer structure as shown in FIG. 5.

Example 7

A water-barrier laminate 11 was obtained in the same manner as in Example 5 but using a commercially available barrier PET film (GX film manufactured by Toppan Printing Co., Ltd.) instead of using the 12 μm-thick PET film having the inorganic barrier layer 3b formed on one surface thereof.

Example 8

A water-barrier laminate 12 was obtained in the same manner as in Example 6 but using the commercially available barrier PET film (GX film manufactured by Toppan Printing Co., Ltd.) instead of using the 12 μm-thick PET film having the inorganic barrier layer 3b formed on one surface thereof.

Example 9

A water-barrier laminate 10 was obtained in the same manner as in Example 1 but using the hygroscopic agent in an amount of 50 parts by weight with respect to the polyallylamine.

Example 10

A gas-barrier laminate 10 was obtained in the same manner as in Example 1 but using the hygroscopic agent in an amount of 1300 parts by weight with respect to the polyallylamine.

Example 11

As the ionic polymer (anionic polymer), there was used a polyacrylic acid (AC-10LP manufactured by Nihon-Junyaku Co.) that was partly neutralized by 80% with sodium hydroxide.

As the crosslinking agent, further, there was provided a diglycidyl 1,2-cyclohexanedicarboxylate.

As the adhesive agent, further, there was provided a β-(3,4-epoxycyclohexyl) ethyltrimethoxysilane.

A water-barrier laminate 10 was obtained in the same manner as in Example 1 but using the above neutralized product of the polyacrylic acid as the ionic polymer, using a mixed solvent of water and acetone (at a weight ratio of 80 to 20) as the solvent, using the crosslinking agent in an amount of 15 parts by weight with respect to the partly neutralized product of the polyacrylic acid, using the adhesive agent in an amount of 3 parts by weight with respect to the partly neutralized product of the polyacrylic acid, and using the hygroscopic agent in an amount of 420 parts by weight with respect to the partly neutralized product of the polyacrylic acid.

Example 12

A water-barrier laminate 10 was obtained in the same manner as in Example 11 but using the hygroscopic agent in an amount of 50 parts by weight with respect to the partly neutralized product of the polyacrylic acid.

Example 13

A water-barrier laminate 10 was obtained in the same manner as in Example 11 but using the hygroscopic agent in an amount of 1300 parts by weight with respect to the partly neutralized product of the polyacrylic acid.

Example 14

The following hygroscopic agent was provided.
Crosslinked product of Na polyacrylate;
  TAFTIC HU-700E (aqueous dispersion) manufactured by Toyobo Co., Ltd.
  Average grain size: 900 nm
  Solid component: 13% by weight
A water-barrier laminate 10 was obtained in the same manner as in Example 1 but using the above hygroscopic agent.

Example 15

By using a bar coater, the above coating solution A described in Example 1 was applied onto a 50 μm-thick PET film (Cosmoshine A4300 manufactured by Toyobo Co., Ltd.). The film after applied with the coating solution A was heat-treated in the box-type electric oven under the conditions of a peak temperature of 120° C. and a peak temperature-holding time of 10 seconds. There was formed a water-trapping layer 1 of a thickness of 4 μm to obtain a coating film C.

Figure 9:
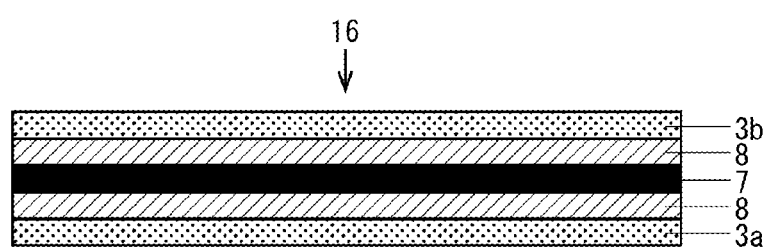
FIG. 9 is a sectional view schematically illustrating the structure of layers of a water-barrier laminate fabricated in Example 15.

Next, the commercially available barrier PET film (GX film manufactured by Toppan Printing Co., Ltd.) was dry-laminated on both sides of the coating film C via an epoxy type adhesive layer 8 of a thickness of 4 μm. In order to cure the adhesive resin layer so will not to absorb moisture, the laminate was aged in vacuum at 50° C. for 3 days. There was obtained a water-barrier laminate 16 as shown in FIG. 9.

Comparative Example 1

The Zeolite 3A (aqueous dispersion, average grain size: 800 nm, solid component: 22% by weight, manufactured by Mizusawa Industrial Chemicals, Ltd.) was provided as the hygroscopic agent.

A water-barrier laminate 10 was obtained in the same manner as in Example 1 but using the above hygroscopic agent.

Comparative Example 2

A silica gel (Lightstar LA-S263, average grain size: 300 nm, solid component: 26% by weight, manufactured by Nissan Chemical Industries, Ltd.) was provided as the hygroscopic agent.

A water-barrier laminate 10 was obtained in the same manner as in Example 1 but using the above hygroscopic agent.

Comparative Example 3

Figure 6:
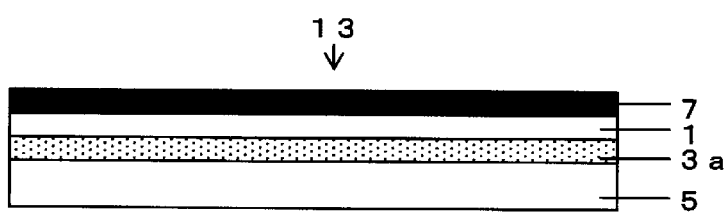
FIG. 6 is a sectional view schematically illustrating the structure of layers of a water-barrier laminate fabricated in Comparative Example 3.

A laminate 13 of a layer structure as shown in FIG. 6 was obtained in the same manner as in Example 1 but without forming the second inorganic barrier layer 3b.

Comparative Example 4

As the hygroscopic agent, there was provided a crosslinked product of Na polyacrylate (TAFTIC HU-720SF, average grain size: 4 μm, manufactured by Toyobo Co., Ltd.).

The above hygroscopic agent was added to a low-density polyethylene (LUMITAC 08L55A manufactured by Tosoh Corporation) in an amount of 43 parts by weight with respect thereto. The mixture was kneaded at 150° C. by using a biaxial kneader/extruder and was extruded. By using a laminator, the extruded sheet was taken up by being sandwiched by two pieces of 12-μm thick PET films, and there was obtained a laminate in which both surfaces of the water-trapping layer 1 having a thickness of 20 μm were protected with the PET films.

The PET films were removed from the laminate in the gloved box in which the nitrogen concentration has been adjusted to be 99.95% or more. Next, the inorganic barrier layer 3a-coated PET film used in Example 1 was dry-laminated on one surface of the water-trapping layer 1 from which the PET film has been removed via an urethane type adhesive layer 6 of a thickness of 4 μm such that the vapor-deposited surface was on the inside.

Next, the inorganic barrier layer 3b-coated PET film (having a thickness of 12 μm) was dry-laminated on the other surface of the water-trapping layer 1 from which the PET film has been removed via an urethane type adhesive layer of a thickness of 4 μm such that the vapor-deposited surface was on the inside.

Figure 7:
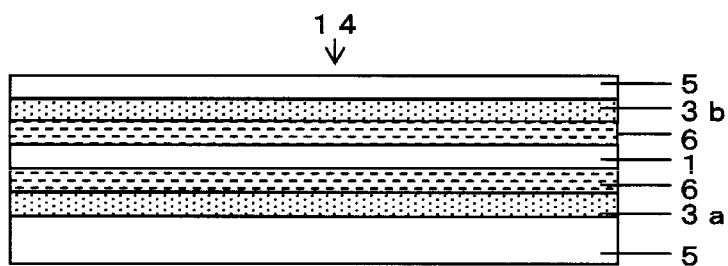
FIG. 7 is a sectional view schematically illustrating the structure of layers of a water-barrier laminate fabricated in Comparative Example 4.

Moreover, in order to cure the urethane type adhesive layer (corresponds to the layer 6 in FIG. 7) so will not to absorb moisture, the laminate was aged at 50° C. for 3 days. There was obtained a laminate 14 of a layer structure as shown in FIG. 7.

<Test for Evaluation>

The sample water-barrier laminates prepared above were measured for their properties relying on the methods described above. Tables 1 and 2 show compositions of the water-trapping laminates 1 and properties of the hygroscopic agents used for forming the water-trapping layers. Tables 3 and 4 show the materials of the organic layers in the water-barrier laminates, presence or absence of the second inorganic layer, as well as evaluated results of various properties.

Tables use the following abbreviations.
γ-GLY-silane:
  γ-glycidoxypropyltrimethylsilane
β-EPO-silane:
  β-(3,4-epoxycyclohexyl)ethyltrimethoxysilane
1,2-DCA-diglycidyl:
  diglycidyl 1,2-cyclohexanedicarboxylate

TABLE 1

| | Ionic polymer (amount) | *1 | *2 | *3 | Hygroscopic agent (amount) | *4 | *5 | Crosslinking agent (amount) | Adhesive agent (amount) |
|---|---|---|---|---|---|---|---|---|---|
| Ex. 1 | polyallylamine (100) | — | 70 | 7.1 | HU-820E (400) | 0.0 | ○ (3.8) | γ-GLY-silane (15) | — |
| Ex. 2 | polyallylamine (100) | 80 | 68 | 7.1 | K salt type crosslinked grains | 0.0 | ○ (3.3) | γ-GLY-silane (15) | — |
| Ex. 3 | polyallylamine (100) | 80 | 65 | 7.1 | Li salt type crosslinked grains | 0.0 | ○ (9.3) | γ-GLY-silane (15) | — |
| Ex. 4 | polyallylamine (100) | 80 | 80 | 7.1 | Cs salt type crosslinked grains | 0.0 | ○ (3.1) | γ-GLY-silane (15) | — |
| Ex. 5 | polyallylamine (100) | — | 70 | 7.1 | HU-820E (400) | 0.0 | ○ (3.8) | γ-GLY-silane (15) | — |
| Ex. 6 | polyallylamine (100) | — | 70 | 7.1 | HU-820E (400) | 0.0 | ○ (3.8) | γ-GLY-silane (15) | — |
| Ex. 7 | polyallylamine (100) | — | 70 | 7.1 | HU-820E (400) | 0.0 | ○ (3.8) | γ-GLY-silane (15) | — |
| Ex. 8 | polyallylamine (100) | — | 70 | 7.1 | HU-820E (400) | 0.0 | ○ (3.8) | γ-GLY-silane (15) | — |
| Ex. 9 | polyallylamine (100) | — | 70 | 7.1 | HU-820E (50) | 0.0 | ○ (3.8) | γ-GLY-silane (15) | — |
| Ex. 10 | polyallylamine (100) | — | 70 | 7.1 | HU-820E (1300) | 0.0 | ○ (3.8) | γ-GLY-silane (15) | — |

*1: Neutralization ratio (%),
*2: Grain size (nm),
*3: Humidity attained by ionic polymer (% RH),
*4: Humidity attained by hygroscopic agent (% RH),
*5: Hygro scopic ratio (Ax/Ay)

TABLE 2

| | Ionic polymer (amount) | *1 | *2 | *3 | Hygroscopic agent (amount) | *4 | *5 | Crosslinking agent (amount) | Adhesive agent (amount) |
|---|---|---|---|---|---|---|---|---|---|
| Ex. 11 | polyacrylic acid (100) | 80 | 70 | 7.9 | HU-820E (420) | 0.0 | ○ (3.8) | *7 (15) | β-EPO-silane (3) |
| Ex. 12 | polyacrylic acid (100) | 80 | 70 | 7.9 | HU-820E (50) | 0.0 | ○ (3.8) | *7 (15) | β-EPO-silane (3) |
| Ex. 13 | polyacrylic acid (100) | 80 | 70 | 7.9 | HU-820E (1300) | 0.0 | ○ (3.8) | *7 (15) | β-EPO-silane (3) |
| Ex. 14 | polyallylamine (100) | — | 900 | 7.1 | HU-700E (400) | 8.2 | ○ (4.2) | γ-GLY-silane (15) | — |
| Ex. 15 | polyallylamine (100) | — | 70 | 7.1 | HU-820E (400) | 0.0 | ○ (3.8) | γ-GLY-silane (15) | — |
| Comp. Ex. 1 | polyallylamine (100) | — | 800 | 7.1 | Zeolite 3A (400) | 0.0 | X (2.1) | γ-GLY-silane (15) | — |
| Comp. Ex. 2 | polyallylamine (100) | — | 300 | 7.1 | *6 (400) | 0.0 | X (2.3) | γ-GLY-silane (15) | — |
| Comp. Ex. 3 | polyallylamine (100) | — | 70 | 7.1 | HU-820E (400) | 0.0 | ○ (3.8) | γ-GLY-silane (15) | — |
| Comp. Ex. 4 | polyallylamine (100) | — | 4000 | 77 | HU-720SF (43) | 9.0 | ○ (4.0) | — | — |

*1: Neutralization ratio (%),
*2: Grain size (nm),
*3: Humidity attained by ionic polymer (% RH),
*4: Humidity attained by hygroscopic agent (% RH),
*5: Hygro scopic ratio (Ax/Ay),
*6: Lightstar LA-S263,
*7: 1,2-DCA-diglycidyl

TABLE 3

| | Organic layer Tg (° C.) | Second inorganic layer | Water vapor permeability (g/m²/day) | Increase in the water absorption |
|---|---|---|---|---|
| Ex. 1 | Vylon GK880 84 | yes | ◉ ($\leq 10^{-5}$) | ○ (1.31) |
| Ex. 2 | Vylon GK880 84 | yes | ◉ ($\leq 10^{-5}$) | ○ (1.22) |
| Ex. 3 | Vylon GK880 84 | yes | ◉ ($\leq 10^{-5}$) | ○ (3.04) |
| Ex. 4 | Vylon GK880 84 | yes | ◉ ($\leq 10^{-5}$) | ○ (1.16) |
| Ex. 5 | PET 69 | yes | ◉ ($\leq 10^{-5}$) | ○ (1.32) |
| Ex. 6 | adhesive layer <60 | yes | ◉ ($\leq 10^{-5}$) | ○ (1.31) |
| Ex. 7 | PET 69 | yes | ◉ ($\leq 10^{-5}$) | ○ (1.32) |
| Ex. 8 | adhesive layer <60 | yes | ◉ ($\leq 10^{-5}$) | ○ (1.31) |
| Ex. 9 | Vylon GK880 84 | yes | ○ ($<10^{-3}$) | ○ (1.30) |
| Ex. 10 | Vylon GK880 84 | yes | ○ ($<10^{-3}$) | ○ (1.30) |

TABLE 4

| | Organic layer Tg (° C.) | Second inorganic layer | Water vapor permeability (g/m²/day) | Increase in the water absorption |
|---|---|---|---|---|
| Ex. 11 | Vylon GK880 84 | yes | ◉ ($\leq 10^{-5}$) | ○ (1.30) |
| Ex. 12 | Vylon GK880 84 | yes | ○ ($<10^{-3}$) | ○ (1.30) |
| Ex. 13 | Vylon GK880 84 | yes | ○ ($<10^{-3}$) | ○ (1.30) |
| Ex. 14 | Vylon GK880 84 | yes | X ($10^{-3}$) | ○ (1.35) |
| Ex. 15 | Vylon GK880 84 | yes | ◉ ($\leq 10^{-5}$) | ○ (1.32) |
| Comp. Ex. 1 | Vylon GK880 83 | yes | X ($10^{-3}$) | X (1.04) |
| Comp. Ex. 2 | Vylon GK880 84 | yes | X ($10^{-3}$) | X (1.06) |
| Comp. Ex. 3 | Vylon GK880 84 | no | X ($10^{-3}$) | X (1.00) |
| Comp. Ex. 4 | Vylon GK880 84 | yes | X ($10^{-3}$) | X (1.08) |

DESCRIPTION OF REFERENCE NUMERALS

1: water-trapping layer
3a: first inorganic barrier layer
3b: second inorganic barrier layer
5: plastic base material
6: urethane type adhesive agent
7: organic layer
8: epoxy type adhesive agent
10, 11, 12, 13, 14, 15, 16: water-barrier laminates

The invention claimed is:

1. A water-barrier laminate having a water-trapping layer in which a hygroscopic agent is dispersed, wherein a hygroscopic agent has such a hygroscopic property that the ratio (Ax/Ay) of a hygroscopic amount Ax at a relative humidity of 80% and a hygroscopic amount Ay at a relative humidity of 30% is not less than 3, the water-trapping layer is positioned between two inorganic barrier layers,
   the water-trapping layer has a dispersion structure in which the hygroscopic agent is dispersed in a matrix of a cationic polymer,
   the matrix of the cationic polymer has a water absorption of 20% or more in an atmosphere of a humidity of 80% RH and 30° C., and has a crosslinked structure provided by a crosslinking agent,
   the crosslinking agent is a silane compound represented by a formula (1):

$$X\text{---}SiR^1{}_n(OR^2)_{3-n} \qquad (1)$$

wherein X is an organic group having an epoxy group at the terminal, $R^1$ and $R^2$ are, respectively, methyl groups, ethyl groups or isopropyl groups, and n is 0, 1 or 2, and
   the hygroscopic agent is a crosslinked product of a monovalent metal salt of a poly(meth)acrylic acid and has an average primary grain size $D_{50}$ not larger than 100 nm.

2. The water-barrier laminate according to claim 1, wherein an organic layer is provided between the inorganic barrier layer on a side of absorbing water and the water-trapping layer.

3. The water-barrier laminate according to claim 2, wherein the two inorganic barrier layers comprise a first inorganic barrier layer formed on a plastic base material and a second inorganic barrier layer formed, via an organic layer, on the water-trapping layer positioned on the first inorganic barrier layer.

* * * * *